(12) United States Patent
Furuya

(10) Patent No.: US 10,340,379 B2
(45) Date of Patent: Jul. 2, 2019

(54) SEMICONDUCTOR DEVICE WITH PLURALITY OF ACTIVE BARRIER SECTIONS

(71) Applicant: Renesas Electronics Corporation, Tokyo (JP)

(72) Inventor: Keiichi Furuya, Ibaraki (JP)

(73) Assignee: Renesas Electronics Corporation, Koutou-ku, Tokyo (JP)

(*) Notice: Subject to any disclaimer, the term of this patent is extended or adjusted under 35 U.S.C. 154(b) by 7 days.

(21) Appl. No.: 15/378,256

(22) Filed: Dec. 14, 2016

(65) Prior Publication Data
US 2017/0186864 A1 Jun. 29, 2017

(30) Foreign Application Priority Data
Dec. 28, 2015 (JP) .................. 2015-256420

(51) Int. Cl.
| | |
|---|---|
| H01L 27/06 | (2006.01) |
| H01L 29/06 | (2006.01) |
| H01L 29/40 | (2006.01) |
| H01L 29/78 | (2006.01) |
| H01L 49/02 | (2006.01) |
| H01L 21/762 | (2006.01) |
| H01L 27/088 | (2006.01) |
| H01L 21/8234 | (2006.01) |

(52) U.S. Cl.
CPC ........ *H01L 29/7823* (2013.01); *H01L 21/762* (2013.01); *H01L 27/0617* (2013.01); *H01L 27/0623* (2013.01); *H01L 28/00* (2013.01); *H01L 28/10* (2013.01); *H01L 29/0649* (2013.01); *H01L 29/408* (2013.01); *H01L 29/7819* (2013.01); *H01L 21/823481* (2013.01); *H01L 27/088* (2013.01); *H01L 29/7816* (2013.01)

(58) Field of Classification Search
CPC . H01L 29/7823; H01L 27/0623; H01L 28/10; H01L 29/0649; H01L 29/7819; H01L 29/408; H01L 27/0617; H01L 29/7816; H01L 21/28061; H01L 28/00; H01L 21/762; H01L 21/823481; H01L 27/088
See application file for complete search history.

(56) References Cited

U.S. PATENT DOCUMENTS

| | | | |
|---|---|---|---|
| 7,880,262 B2* | 2/2011 | Yamamoto | .......... H01L 27/0629 257/501 |
| 2004/0232522 A1* | 11/2004 | Shimizu | ................ H01L 21/763 257/548 |
| 2009/0189247 A1 | 7/2009 | Yamamoto | |
| 2011/0089533 A1* | 4/2011 | Yamamoto | .......... H01L 27/0629 257/544 |

FOREIGN PATENT DOCUMENTS

JP 2009-177087 A 8/2009

\* cited by examiner

*Primary Examiner* — Mohsen Ahmadi
*Assistant Examiner* — Scott E Bauman
(74) *Attorney, Agent, or Firm* — Sughrue Mion, PLLC

(57) ABSTRACT

A semiconductor device according to an embodiment is provided with a plurality of active barrier sections each of which is enclosed by a plurality of element isolation sections each of which is configured of a closed pattern. Namely, the plurality of active barrier sections are electrically isolated from each other.

17 Claims, 18 Drawing Sheets

US 10,340,379 B2

SEMICONDUCTOR DEVICE WITH PLURALITY OF ACTIVE BARRIER SECTIONS

CROSS-REFERENCE TO RELATED APPLICATION

The present application claims priority from Japanese Patent Application No. 2015-256420 filed on Dec. 28, 2015, the content of which is hereby incorporated by reference into this application.

TECHNICAL FIELD OF THE INVENTION

The present invention relates to a semiconductor device, for example, to a technique effectively applied to a semiconductor device in which an active barrier section to suppress injection of a charge from an output element is formed.

BACKGROUND OF THE INVENTION

Japanese Patent Application Laid-Open Publication No. 2009-177087 (Patent Document 1) describes a technique relating to a semiconductor device in which an active barrier structure having a function of suppressing movement of electrons from a formation region of an output transistor to a formation region of another element is formed.

SUMMARY OF THE INVENTION

For example, when an output element (power transistor) included in a semiconductor device is connected to a load having an inductance in the semiconductor device to be used in an automobile, a motor drive, an audio amplifier and the like, a drain of the output element becomes a negative potential in some cases due to a back electromotive force caused by the inductance. In this case, a pn junction, which is formed at a boundary between a p type semiconductor substrate and a drain region serving as an n type semiconductor region, is forward biased, and as a result, electrons are injected from the drain region into the semiconductor substrate. Then, the electrons injected into the semiconductor substrate move into another element constituting a different circuit via the semiconductor substrate, which sometimes causes a malfunction of the element constituting the different circuit.

As a countermeasure therefor, for example, there is the technique of forming an active barrier section so as to surround the circuits whose malfunction needs to be suppressed as illustrated in FIG. 2 of Patent Document 1. The active barrier section has a structure in which a p type semiconductor layer and an n type semiconductor layer are formed on a semiconductor substrate and the p type semiconductor layer and the n type semiconductor layer are electrically connected via a conductor pattern such as a wiring.

The inventor of the present invention has conducted a study regarding this active barrier section, and has found out that it is necessary to conduct a study for improvement from a viewpoint of sufficiently suppressing the injection of electrons into another element constituting a different circuit from the output element in a configuration of the active barrier section having the conventional structure. In particular, the inventor of the present invention has newly found out a phenomenon in which, when a plurality of output elements serving as an injection source of electrons are present adjacently to a circuit and each injection amount of electrons from the plurality of output elements to the circuit is different, the injection amount of electrons into the circuit conversely increases depending on conditions in the active barrier section having the conventional structure. Accordingly, it is necessary to conduct the study for improvement from the viewpoint of suppressing the injection of electrons into the circuit in the active barrier section having the conventional structure according to the study by the inventor of the present invention.

The other problems and novel characteristics of the present invention will be apparent from the description of the present specification and the accompanying drawings.

A semiconductor device according to an embodiment is provided with a plurality of barrier sections each of which is enclosed by each of a plurality of element isolation sections each of which is configured of a closed pattern.

According to the embodiment, it is possible to suppress the malfunction of the semiconductor device, so that it is possible to improve the reliability of the semiconductor device.

BRIEF DESCRIPTIONS OF THE DRAWINGS

DESCRIPTIONS OF THE PREFERRED EMBODIMENTS

Figure 1:
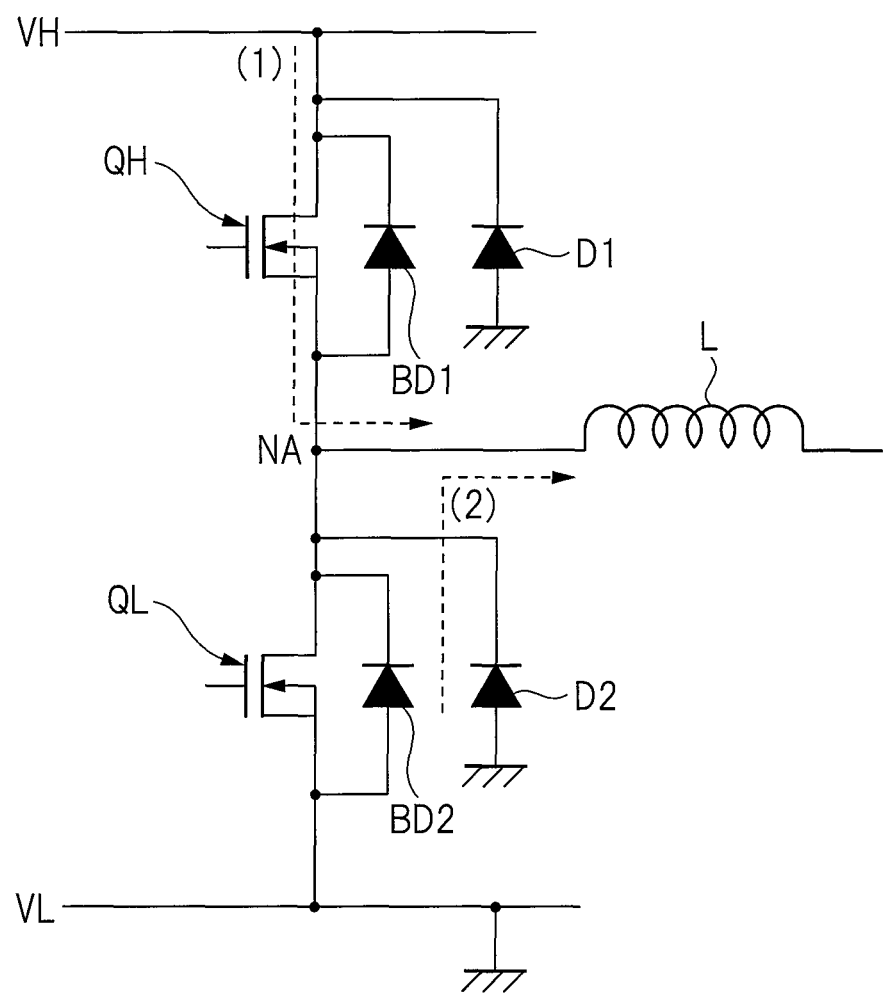
FIG. 1 is a circuit diagram illustrating a configuration example of an output unit according to a first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, the same components are denoted by the same reference characters throughout the drawings for describing the embodiments, and the repetitive description thereof is omitted. Note that hatching is used even in a plan view in some cases so as to make the drawings easy to see.

First Embodiment

Configuration Example of Output Unit

FIG. 1 is a circuit diagram illustrating a configuration example of an output unit according to the first embodiment. As illustrated in FIG. 1, the output unit according to the first embodiment is configured of a power transistor QH and a power transistor QL which are connected to each other in series between a power supply line VH to which a power supply potential is applied and a ground line VL to which a ground potential (GND potential) serving as a reference potential is applied. At this time, the power transistor QH connected on a side of the power supply line VH is referred to as a high-side element, and the power transistor QL connected on a side of the ground line VL is referred so as a low-side element.

In the present specification, the "power transistor" means an aggregation of unit transistors which realizes the function of the unit transistor even with a current higher than an allowable current of the unit transistor by connecting a plurality of the unit transistors (cell transistors) with each other in parallel (for example, connecting several thousands or hundreds of thousands of the unit transistors in parallel). For example, when the unit transistor functions as a switching element, the "power transistor" serves as the switching element to which a current higher than the allowable current of the unit transistor can be applied.

In the first embodiment, it is assumed that each of the power transistor QH and the power transistor QL is configured of a power MOSFET (Metal Oxide Semiconductor Field Effect Transistor). In this case, a body diode BD1 is parasitically formed between a source and a drain of the power transistor QH, and a body diode BD2 is parasitically formed also between a source and a drain of the power transistor QL. In addition, in the first embodiment, a diode D1 is parasitically formed between the drain of the power transistor QH and a ground, and a diode D2 is parasitically formed between the drain of the power transistor QL and the ground because of the device structure to be described later with reference to FIG. 2.

Further, a load having an inductance L is electrically connected to a connection node NA to which the source of the power transistor QH and the drain of the power transistor QL are connected in the output unit according to the first embodiment. Examples of the load having the inductance include a motor and the like. Namely, the output unit according to the first embodiment is configured to be electrically connectable to the load having the inductance L and to drive the load having the inductance L.

Specifically, in the output unit according to the first embodiment, the power transistor QH and the power transistor QL function as the switching elements, thereby controlling the drive of the load. For example, the output unit according to the first embodiment controls on/off of a current flowing between the drain and the source of the power transistor QH by controlling a gate voltage to be applied to a gate electrode of the power transistor QH. Similarly, the output unit according to the first embodiment controls on/off of a current flowing between the drain and the source of the power transistor QL by controlling a gate voltage to be applied to a gate electrode of the power transistor QL. To be specific, the output unit according to the first embodiment controls the power transistor QL to be turned off when the power transistor QH is turned on, and controls the power transistor QH to be turned off when the power transistor QL is turned on. As a result, for example, it is possible to control a direction of the current flowing to the load having the inductance L, and accordingly, it is possible to drive the load. For example, the current flows in a path from the power supply line VH through the power transistor QH to the inductance L (load) when the power transistor QH is turned on and the power transistor QL is turned off. Meanwhile, the current flows in a path from the inductance L (load) through the power transistor QL to the ground line VL when the power transistor QL is turned on and the power transistor QH is turned off. Accordingly, since it is possible to control the direction of the current flowing in the inductance L (load), it is possible to drive the load (motor or the like).

Here, on/off of the power transistor QH and on/off of the power transistor QL are alternately switched in the output unit according to the first embodiment. However, it is difficult to adjust the on/off timing in practice, and the timing mismatch occurs. Accordingly, there is a case in which both the power transistor QH and the power transistor QL are turned on at the same time due to the on/off timing mismatch. In this case, there is a possibility that the power supply line VH and the ground line VL are short-circuited, with a result that a through current (high current) flows between the power supply line VH and the ground line VL and the thermal breakdown of an element occurs. For this reason, a dead time at which both the power transistor QH and the power transistor QL are turned off at the same time is provided when on/off of the power transistor QH and on/off of the power transistor QL are alternately switched in the output unit according to the first embodiment. In this case, since it is possible to prevent the power transistor QH and the power transistor QL from being simultaneously turned on, it is possible to prevent the through current from flowing between the power supply line VH and the ground line VL.

However, a matter that needs to be improved occurs in the configuration of the output unit according to the first embodiment due to the presence of the dead time that is provided in order to prevent the through current.

In FIG. 1, for example, the current flows in a path from the power supply line VH through the power transistor QH to the inductance L (load) as indicated by a dotted arrow (1) of FIG. 1 when the power transistor QH is turned on and the power transistor QL is turned off. Subsequently, in order to prevent both the power transistor QH and the power transistor QL from being simultaneously turned on when on/off of the power transistor QH and on/off of the power transistor QL are switched, the power transistor QH is turned off and the power transistor QL is turned off (dead time). In this case, the current indicated by the dotted arrow (1) of FIG. 1 is cut off. This means the decrease of the current flowing to the inductance L. Since the inductance L has a function of increasing a flowing current by suppressing the decrease of the current when the current flowing to the inductance L decreases, the current flows in a path from the ground line VL through the body diode BD2 and the diode D2 to the inductance L (load) as indicated by a dotted arrow (2) of FIG. 1 at the dead time. This means that a potential of the drain of the power transistor QL serving as the low-side element (the connection node NA) becomes lower than a potential of the source of the power transistor QL (the ground line VL). Namely, the drain of the power transistor QL serving as the low-side element becomes a negative potential in the dead time. As a result, a malfunction is likely to occur in the semiconductor device according to the first embodiment due to a mechanism to be described later. In other words, the semiconductor device according to the first embodiment is configured on the premise that not only the output unit but also another circuit unit formed of an integrated circuit is formed in the semiconductor chip. Further, since the drain of the power transistor QL becomes the negative potential, electrons are likely to be injected from the power transistor QL into the other circuit unit in this presumed configuration, and the risk of causing the malfunction in the circuit unit is increased due to this unintended injection of electrons. This mechanism will be described based on the device structure illustrated in FIG. 2 after the device structure of the semiconductor chip according to the first embodiment is described with reference to FIG. 2.

<Device Structure (Cross-Sectional Structure) of Semiconductor Chip>

Figure 2:
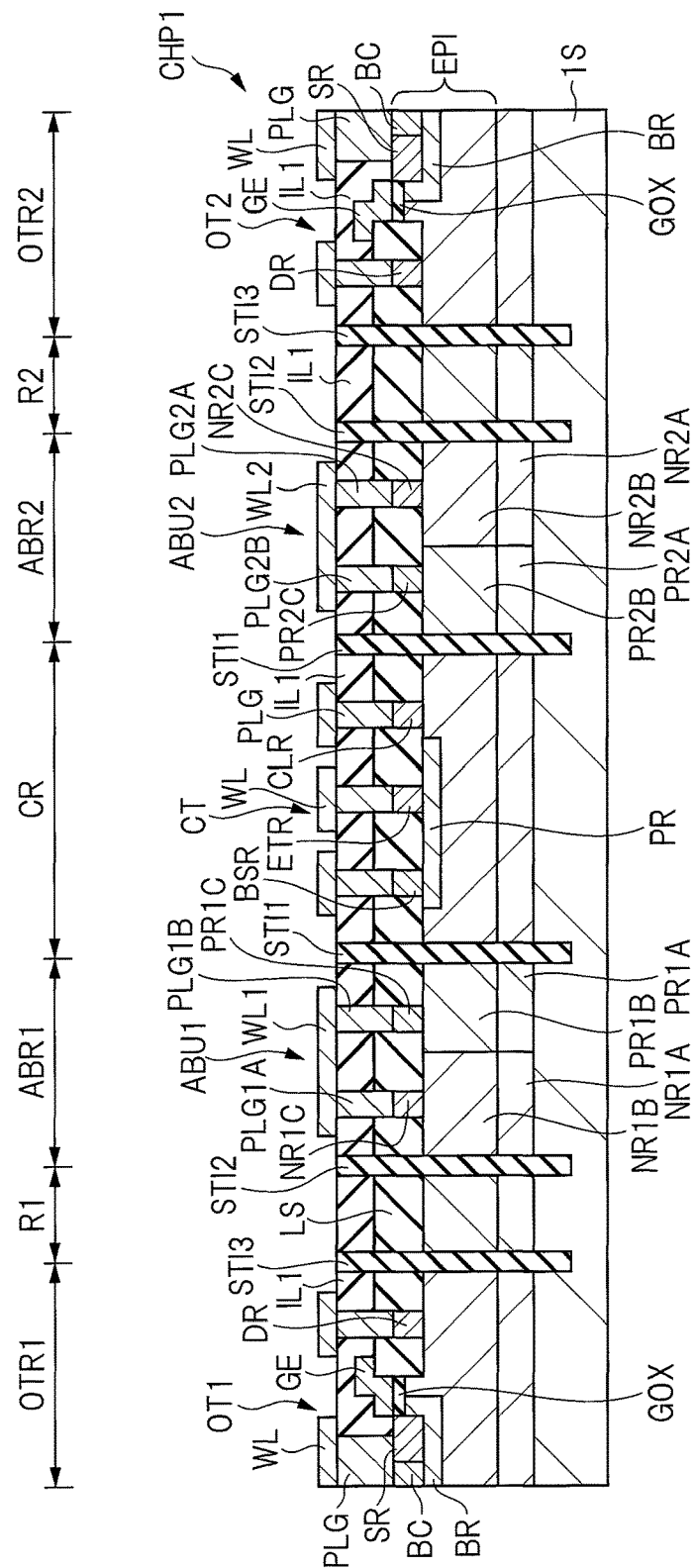
FIG. 2 is a cross-sectional view illustrating a device structure of a semiconductor chip according to the first embodiment.

FIG. 2 is a cross-sectional view illustrating a device structure of a semiconductor chip CHP1 according to the first embodiment. In FIG. 2, the semiconductor chip CHP1 includes a circuit unit formation region CR at a central portion thereof, and an active barrier region ABR1 and an active barrier region ABR2 are provided on outer sides with the circuit unit formation region CR interposed therebetween. Further, the semiconductor chip CHP1 includes an output unit formation region OTR1 on an outer side of the active barrier region ABR1 with a space region R1 interposed therebetween and an output unit formation region OTR2 on an outer side of the active barrier region ABR2 with a space region R2 interposed therebetween.

A circuit unit CT is formed in the circuit unit formation region CR. In this circuit unit CT, for example, an integrated circuit including a field effect transistor and a bipolar transistor is formed, and a control circuit which controls the switching of the power transistor QH and the power transistor QL constituting the output unit illustrated in FIG. 1 is formed. To be specific, the circuit unit CT includes a control circuit that controls the gate voltage to be applied to the gate electrode of the power transistor QH and a control circuit that controls the gate voltage to be applied to the gate electrode of the power transistor QL. In particular, a bipolar transistor is illustrated in FIG. 2 as an example of the circuit unit CT formed in the circuit unit formation region CR. Namely, in the semiconductor chip CHP1 according to the first embodiment, an epitaxial layer EPI serving as an n type semiconductor layer is formed on a p type semiconductor substrate 1S in the circuit unit formation region CR, and a p type semiconductor region PR is formed on a surface of the epitaxial layer EPI. Here, for example, an $n^+$ type semiconductor layer is formed in the semiconductor substrate 1S, and an $n^-$ type semiconductor layer which is the epitaxial layer EPI is formed on the $n^+$ type semiconductor layer as illustrated in FIG. 2. Further, a LOCOS (Local Oxidation of Silicon) insulating film LS made of, for example, a silicon oxide film is formed on the surface of the epitaxial layer EPI. A base region BSR of the bipolar transistor which is a $p^+$ type semiconductor region, an emitter region ETR of the bipolar transistor which is an $n^+$ type semiconductor region and a collector region CTR of the bipolar transistor which is the $n^+$ type semiconductor region are formed in the surface of the epitaxial layer EPI sandwiched between the LOCOS insulating films LS. At this time, the p type semiconductor region PR is formed so as to be in contact with the base region BSR and the emitter region ETR. In this manner, the circuit unit CT including the npn bipolar transistor is formed in the circuit unit formation region CR, for example, as illustrated in FIG. 2. Note that each of the base region BSR, the emitter region ETR and the collector region CTR of the bipolar transistor is electrically connected to a wiring WL formed on an interlayer insulating film IL via a plug PLG that penetrates the interlayer insulating film IL made of, for example, a silicon oxide film. The circuit unit formation region CR having the circuit unit CT configured in the above-described manner is partitioned by isolation sections STI1, for example, as illustrated in FIG. 2. The isolation section STI1 is formed of a structure in which an insulating film is embedded in a trench that penetrates an interlayer insulating film IL1, the LOCOS insulating film LS and the epitaxial layer EPI and reaches the semiconductor substrate 1S.

Next, the active barrier region ABR1 is arranged on an outer left side of the circuit unit formation region CR with the isolation section STI1 interposed therebetween as illustrated in FIG. 2. The active barrier region ABR1 is partitioned by the isolation section STI1 and an isolation section STI2. Here, the isolation section STI2 is also formed of a structure in which an insulating film is embedded in a trench that penetrates the interlayer insulating film IL1, the LOCOS insulating film LS and the epitaxial layer EPI and reaches the semiconductor substrate 1S like the isolation section STI1. Further, an active barrier section ABU1 is formed in the active barrier region ABR1.

Hereinafter, a structure of the active barrier section ABU1 will be described. The active barrier section ABU1 includes a $p^+$ type semiconductor layer PR1A formed in the semiconductor substrate 1S and a p type semiconductor layer PR1B formed on the $p^+$ type semiconductor layer PR1A. In addition, the active barrier section ABU1 includes an $n^+$ type semiconductor layer NR1A formed in the semiconductor substrate 1S and an n type semiconductor layer NR1B formed on the $n^+$ type semiconductor layer NR1A. At this time, the $n^+$ type semiconductor layer NR1A is arranged to be adjacent to the $p^+$ type semiconductor layer PR1A and farther from the circuit unit formation region CR than the $p^+$ type semiconductor layer PR1A. In other words, the $p^+$ type semiconductor layer PR1A is formed to be sandwiched between the $n^+$ type semiconductor layer NR1A and the isolation section STI1. Similarly, the $n^-$ type semiconductor layer NR1B is arranged to be adjacent to the p type semiconductor layer PR1B and farther from the circuit unit formation region CR than the p type semiconductor layer PR1B. In other words, the p type semiconductor layer PR1B is formed to be sandwiched between the $n^-$ type semiconductor layer NR1B and the isolation section STI1. Further, the LOCOS insulating film LS is formed over the n type semiconductor layer NR1B and the p type semiconductor layer PR1B, and a $p^+$ type semiconductor layer PR1C to be connected to the p type semiconductor layer PR1B and an $n^+$ type semiconductor layer NR1C to be connected to the n type semiconductor layer NR1B are formed on the surface of the epitaxial layer EPI sandwiched between the LOCOS insulating films LS. Further, the $p^+$ type semiconductor layer PR1C is electrically connected to a plug PLG1B penetrating the interlayer insulating film IL1, and the $n^+$ type semiconductor layer NR1C is electrically connected to a plug PLG1A penetrating the interlayer insulating film IL1. Further, the plug PLG1A and the plug PLG1B are electrically connected to each other via a wiring WL1 made of a metal wiring formed on the interlayer insulating film IL1. The wiring WL1 can be formed of an aluminum wiring or an aluminum alloy wiring.

According to the above, the active barrier section ABU1 includes a first semiconductor layer (the p type semiconductor layer PR1B and the $p^+$ type semiconductor layer PR1C) and a second semiconductor layer (the $n^-$ type semiconductor layer NR1B and the $n^+$ type semiconductor layer NR1C) which is formed on the semiconductor substrate 1S and arranged to be adjacent to the first semiconductor layer so as to be farther from the circuit unit than the first semiconductor layer. The active barrier section ABU1 further includes a first conductor pattern (the wiring WL1) that electrically connects the first semiconductor layer and the second semiconductor layer. In this manner, the active barrier section ABU1 according to the first embodiment is configured.

Subsequently, as illustrated in FIG. 2, the space region R1 sandwiched between the isolation section STI2 and an isolation section STI3 is arranged on an outer left side of the active barrier region ABR1, and the output unit formation region OTR1 is arranged on an outer left side of the space region R1 with the isolation section STI3 interposed therebetween. Here, the isolation section STI3 is also formed of a structure in which an insulating film is embedded in a trench that penetrates the interlayer insulating film IL1, the LOCOS insulating film LS and the epitaxial layer EPI and reaches the semiconductor substrate 1S like the isolation section STI1 and the isolation section STI2. Further, an output unit OT1 is formed in the output unit formation region OTR1. Specifically, FIG. 2 illustrates an output element formed of a power transistor constituting a part of the output unit OT1. The output unit OT1 formed in the output unit formation region OTR1 is configured of, for example, the power transistor QH and the power transistor QL constituting the circuit illustrated in FIG. 1, and is configured to be connectable to a load having an inductance. FIG. 2 particularly illustrates the power transistor serving as the low-side element (corresponding to the power transistor QL in FIG. 1). Note that FIG. 2 does not illustrate the power transistor serving as the high-side element (corresponding to the power transistor QH in FIG. 1), but the power transistor constituting the low-side element and the power transistor constituting the high-side element have the same device structure.

Hereinafter, a device structure of the power transistor (output element) as a component of the output unit OT1 illustrated in FIG. 2 will be described. In FIG. 2, the power transistor includes the epitaxial layer EPI formed on the semiconductor substrate 1S having the $n^+$ type semiconductor layer formed on the surface thereof, and the epitaxial layer EPI is a drift layer and serves as a drain of the power transistor. A body region BR formed of the p type semiconductor region is formed in the vicinity of the surface of the epitaxial layer EPI, and a body contact region BC formed of the $p^+$ type semiconductor region and a source region SR formed of the $n^+$ type semiconductor region are formed so as to be in contact with the body region BR. Further, a gate insulating film GOX is formed on the surface of the epitaxial layer EPI in contact with the source region SR, and the LOCOS insulating film LS is formed to be in contact with the gate insulating film GOX. Further, a gate electrode GE is formed to run on the LOCOS insulating film LS from a top of the gate insulating film GOX, while a drain region DR formed of the $n^+$ type semiconductor region is formed on the surface of the epitaxial layer EPI sandwiched between the LOCOS insulating films LS. Further, as illustrated in FIG. 2, the body contact region BC and the source region SR are electrically connected to each other via the plug PLG penetrating the interlayer insulating film IL1 and the wiring WL formed on the interlayer insulating film IL1. In addition, the drain region DR is also electrically connected to the wiring WL (the wiring WL which is different from the wiring WL electrically connected to the source region SR) formed on the interlayer insulating film IL1 via the plug PLG that penetrates the interlayer insulating film IL1. In the above-described manner, the power transistor constituting the output unit OT1 is formed in the output unit formation region OTR1.

Incidentally, when focusing on the arrangement relation among the circuit unit formation region CR, the active barrier region ABR1 and the output unit formation region OTR1 in FIG. 2, the arrangement of components of the active barrier section ABU1 can be expressed as follows. That is, it can be said that the $n^+$ type semiconductor layer NR1A is arranged at a position closer to the output unit OT1 than the $p^+$ type semiconductor layer PR1A and the n type semiconductor layer NR1B is arranged at a position closer to the output unit OT1 than the p type semiconductor layer PR1B as illustrated in FIG. 2.

Next, as illustrated in FIG. 2, the active barrier region ABR2 is arranged on an outer right side of the circuit unit formation region CR with the isolation section STI1 interposed therebetween. The active barrier region ABR2 is partitioned by the isolation section STI1 and an isolation section STI2. Further, an active barrier section ABU2 is formed in the active barrier region ABR2.

The active barrier section ABU2 has the same configuration as the active barrier section ABU1, and the active barrier section ABU1 and the active barrier section ABU2 have a symmetrical structure with respect to the circuit unit formation region CR.

Specifically, the active barrier section ABU2 includes a $p^+$ type semiconductor layer PR2A formed in the semiconductor substrate 1S and a p type semiconductor layer PR2B formed on the $p^+$ type semiconductor layer PR2A. In addition, the active barrier section ABU2 includes an $n^+$ type semiconductor layer NR2A formed in the semiconductor substrate 1S and an n type semiconductor layer NR2B formed on the $n^+$ type semiconductor layer NR2A. Further, the LOCOS insulating film LS is formed over the n type semiconductor layer NR2B and the p type semiconductor layer PR2B, and each of a $p^+$ type semiconductor layer PR2C to be connected to the p type semiconductor layer PR2B and an $n^+$ type semiconductor layer NR2C to be connected to the $n^-$ type semiconductor layer NR2B is formed on the surface of the epitaxial layer EPI sandwiched between the LOCOS insulating films LS. Further, the $p^+$ type semiconductor layer PR2C is electrically connected to a plug PLG2B penetrating the interlayer insulating film IL1, and the $n^+$ type semiconductor layer NR2C is electrically connected to a plug PLG2A penetrating the interlayer insulating film IL1. In addition, the plug PLG2A and the plug PLG2B are electrically connected to each other via a wiring WL2 made of a metal wiring formed on the interlayer insulating film IL1. The wiring WL2 can be formed of an aluminum wiring or an aluminum alloy wiring.

According to the above, the active barrier section ABU2 includes a third semiconductor layer (the p type semiconductor layer PR2B and the $p^+$ type semiconductor layer PR2C) formed on the semiconductor substrate 1S and a fourth semiconductor layer (the $n^-$ type semiconductor layer NR2B and the $n^+$ type semiconductor layer NR2C) formed on the semiconductor substrate 1S and arranged to be adjacent to the third semiconductor layer so as to be farther from the circuit unit than the third semiconductor layer. Further, the active barrier section ABU2 includes a second conductor pattern (the wiring WL2) that electrically connects the third semiconductor layer and the fourth semiconductor layer. In this manner, the active barrier section ABU2 according to the first embodiment is configured.

Subsequently, as illustrated in FIG. 2, the space region R2 sandwiched between the isolation section STI2 and an isolation section STI3 is arranged on an outer right side of the active barrier region ABR2, and an output unit formation region OTR2 is arranged on an outer right side of the space region R2 with the isolation section STI3 interposed therebetween.

An output unit OT2 is formed in the output unit formation region OTR2. Specifically, FIG. 2 illustrates an output element formed of a power transistor constituting a part of the output unit OT2. The output unit OT2 formed in the output unit formation region OTR2 has the same configuration as the output unit OT1 formed in the output unit formation region OTR1. To be specific, for example, the output unit OT1 and the output unit OT2 are symmetrically arranged with respect to the circuit unit formation region CR. The output unit OT2 is also configured to be connectable to a load having an inductance. In particular, the first embodiment assumes a case in which the load to be connected to the output unit OT1 and the load to be connected to the output unit OT2 are different from each other. Namely, it can be said that a plurality of output units (the output unit OT1 and the output unit OT2) which can be connected to different loads are formed in the semiconductor chip CHP1 according to the first embodiment. Since the power transistor serving as the component of the output unit OT2 has the same configuration as the power transistor serving as the component of the output unit OT1, the description thereof will be omitted.

Incidentally, when focusing on the arrangement relation among the circuit unit formation region CR, the active barrier region ABR2 and the output unit formation region OTR2 in FIG. 2, the arrangement of components of the active barrier section ABU2 can be expressed as follows.

For example, the $n^+$ type semiconductor layer NR2A is arranged to be adjacent to the $p^+$ type semiconductor layer PR2A and farther from the circuit unit formation region CR than the $p^+$ type semiconductor layer PR2A. In other words, the $p^+$ type semiconductor layer PR2A is formed to be sandwiched between the $n^+$ type semiconductor layer NR2A and the isolation section STI1. Similarly, the n type semiconductor layer NR2B is arranged to be adjacent to the p type semiconductor layer PR2B and farther from the circuit unit formation region CR than the p type semiconductor layer PR2B. In other words, the p type semiconductor layer PR2B is formed to be sandwiched between the n type semiconductor layer NR2B and the isolation section STI1. Furthermore, it can be said that the $n^+$ type semiconductor layer NR2A is arranged at a position closer to the output unit OT2 than the $p^+$ type semiconductor layer PR2A and the $n^-$ type semiconductor layer NR2B is arranged at a position closer to the output unit OT2 than the p type semiconductor layer PR2B as illustrated in FIG. 2.

<Structure Unique to Semiconductor Chip in which Power Transistor and Integrated Circuit are Consolidated>

Next, a structure unique to the semiconductor chip CHP1 in which the circuit unit CT including the integrated circuit formed of a field effect transistor and a bipolar transistor and the power transistors serving as components of the output units (OT1 and OT2) connected to the loads are consolidated (hereinafter, referred to also as a consolidated article) will be described. Namely, since the semiconductor chip CHP1 according to the first embodiment has the structure in which the integrated circuit and the power transistor are consolidated and has the unique structure which is different from that of a semiconductor chip in which only a single power transistor is formed (hereinafter, referred to as a discrete article), this point will be described hereinafter.

The semiconductor chip CHP1 according to the first embodiment assumes that not only the output units (OT1 and OT2) but also the circuit unit CT configured of other integrated circuits is formed inside the semiconductor chip CHP1, for example, as illustrated in FIG. 2. Accordingly, the device structure of the semiconductor chip CHP1 in which the power MOSFETs constituting the output units (OT1 and OT2) according to the first embodiment are formed is configured to be different from a device structure of the discrete article in which the single power MOSFET is formed. Namely, a vertical structure in which a current is caused to flow in a thickness direction of a semiconductor chip is usually employed in the power MOSFET of the discrete article, and a back surface of the semiconductor chip functions as a drain electrode in the power MOSFET having the vertical structure. In other words, the power MOSFET of the discrete article has a structure in which a drain is formed of an n type semiconductor substrate and an epitaxial layer (n type semiconductor layer) formed on the n type semiconductor substrate and the drain electrode is formed on a back surface of the n type semiconductor substrate as a back surface electrode. In this manner, the discrete article is generally configured so that the drain electrode is formed on the back surface of the semiconductor chip.

On the other hand, not only the output units (OT1 and OT2) formed of the power MOSFETs but also the other circuit unit CT is formed inside the semiconductor chip CHP1 in a consolidated article such as the semiconductor chip CHP1 according to the first embodiment. In this case, the back surface of the semiconductor chip is configured to function as an electrode to supply a ground potential instead of the drain electrode so as to be able to supply the ground potential required for the other circuit unit CT. Namely, in the configuration in which the output units (OT1 and OT2) and the other circuit unit CT are consolidated in the single semiconductor chip CHP1, for example, the p type semiconductor substrate is employed to function as the ground and the epitaxial layer EPI to be the drain of the power MOSFET constituting each of the output units (OT1 and OT2) is formed on the p type semiconductor substrate as illustrated in FIG. 2. As a result, in the device structure in which the other circuit unit CT is formed together with the output units (OT1 and OT2) constituted of the power MOSFETs inside the semiconductor chip CHP1, a pn junction is formed in a boundary region between the p type semiconductor substrate 1S and the epitaxial layer EPI serving as the n type semiconductor layer. Namely, since the back surface of the semiconductor substrate is used as the drain electrode, the structure in which the epitaxial layer serving as the n type semiconductor layer is formed on the n type semiconductor substrate is inevitably formed in the discrete article. In this structure, the semiconductor substrate and the epitaxial layer have the same conductivity type, and thus no pn junction is formed between the semiconductor substrate and the epitaxial layer. On the contrary, since the semiconductor substrate 1S is not used as the drain but is used as the ground in the semiconductor chip CHP1 in which the output units (OT1 and OT2) formed of the power MOSFETs and the other circuit unit CT are consolidated, the pn junction is inevitably formed in the boundary region between the semiconductor substrate and the epitaxial layer EPI. Namely, the structure unique to the consolidated article in which the circuit unit CT including the integrated circuit and the power transistors serving as the components of the output units (OT1 and OT2) to be connected to the loads are consolidated as illustrated in FIG. 2 is the structure in which the pn junction is formed between the semiconductor substrate 1S and the epitaxial layer EPI. In other words, it can be said that the structure unique to the consolidated article in which the circuit unit CT and the output units (OT1 and OT2) are consolidated is a structure in which the conductivity type of the semiconductor substrate 1S and the conductivity type of the epitaxial layer EPI are different from each other. As a result, not only the parasitic body diodes (BD1 and BD2 in FIG. 1) formed of the body region BR (the p type semiconductor region) and the epitaxial layer EPI (the n type semiconductor layer), but also the parasitic diodes (D1 and D2 in FIG. 1) formed of the semiconductor substrate 1S and the epitaxial layer EPI are formed in the power transistors constituting the output units (OT1 and OT2), for example, as illustrated in FIG. 2. Namely, not only the parasitic body diodes (BD1 and BD2 in FIG. 1) but also the parasitic diodes (D1 and D2 in FIG. 1) are formed in the device structure of the power transistor of the consolidated article while only the parasitic body diodes (BD1 and BD2 in FIG. 1) are formed in the device structure of the power transistor of the discrete article. This point corresponds to the device structure unique to the power transistor formed in the consolidated article. Thus, for the reason that the consolidated article has the unique device structure described above, unintended injection of electrons from the power transistor into the circuit unit CT is caused as the drain of the power transistor constituting each of the output units (OT1 and OT2) becomes the negative potential, and accordingly, a malfunction is likely to occur in the device constituting the circuit unit CT.

<Mechanism to Cause Malfunction>

Hereinafter, the mechanism to cause such a malfunction will be described with reference to FIGS. 1 and 2. First, in FIG. 1, the current flows in the path indicated by the dotted arrow (2) via the body diode BD2 and the diode D2 during the dead time due to a property of the inductance L to hinder a current change. At this time, when focusing on the power transistor QL serving as the low-side element, the fact that the current flows from the ground line VL toward the connection node NA means that the potential of the drain of the power transistor QL (the connection node NA) becomes lower than the potential of the source of the power transistor QL (ground). This means that the drain of the power transistor QL becomes the negative potential.

In this case, for example, the power transistor constituting the output unit OT1 in FIG. 2 is assumed to be the power transistor QL illustrated in FIG. 1. In this case, the epitaxial layer EPI serving as the drain of the power transistor constituting the output unit OT1 becomes a negative potential with respect to the semiconductor substrate 1S. Accordingly, the fact that the drain of the power transistor constituting the output unit OT1 becomes the negative potential means that a forward bias is applied to the pn junction formed between the epitaxial layer EPI and the semiconductor substrate 1S, and accordingly, electrons are injected from the epitaxial layer EPI into the semiconductor substrate 1S. Since a p type impurity concentration of the semiconductor substrate 1S is low, there is a low probability that the electrons injected into the semiconductor substrate 1S are recombined with holes in the semiconductor substrate 1S. Accordingly, the electrons injected into the semiconductor substrate 1S pass through the semiconductor substrate 1S and are injected into the epitaxial layer EPI formed in the circuit unit formation region CR. Namely, the electrons flow into the circuit unit CT formed in the circuit unit formation region CR. In particular, the electrons flow into the collector region CLR in the case of the bipolar transistor as illustrated in FIG. 2. For example, such flowing of the electrons into the collector region CLR causes the malfunction as if the bipolar transistor is turned on even though the bipolar transistor is in an off state. When the drain of the power transistor constituting each of the output units (OT1 and OT2) becomes the negative potential due to the inductance L included in the load by the above-described mechanism, for example, the unintended injection of electrons from the power transistor into the circuit unit CT is caused, and accordingly, the malfunction is likely to occur in the device constituting the circuit unit CT.

In this regard, in the semiconductor chip CHP1 according to the first embodiment, for example, the active barrier region ABR1 is provided between the output unit formation region OTR1 and the circuit unit formation region CR, and the active barrier region ABR2 is provided between the output unit formation region OTR2 and the circuit unit formation region CR as illustrated in FIG. 2. The active barrier section ABU1 formed in the active barrier region ABR1 has a function of suppressing the unintended injection of electrons (charge) from the output unit OT1 into the circuit unit CT. Similarly, the active barrier section ABU2 formed in the active barrier region ABR2 has a function of suppressing the unintended injection of electrons (charge) from the output unit OT2 into the circuit unit CT. Namely, the unintended injection of electrons from the power transistor into the circuit unit CT is suppressed by providing the active barrier section ABU1 and the active barrier section ABU2, and it is thus possible to suppress the malfunction in the device constituting the circuit unit CT. Hereinafter, usefulness of the active barrier section ABU1 and the active barrier section ABU2 that have the above-described function will be described. In particular, since the active barrier section ABU1 and the active barrier section ABU2 have the similar function, the description will be given focusing on the active barrier section ABU1.

<Usefulness of Active Barrier Section>

First, a case in which electrons are injected from the epitaxial layer EPI formed in the output unit formation region OTR1 into the semiconductor substrate 1S due to an inductance included in a load connected to the output unit OT1 will be considered. In this case, when the active barrier section ABU1 is present, the electrons injected into the semiconductor substrate 1S flow into the n type semiconductor layers (NR1A, NR1B and NR1C) of the active barrier section ABU1. Meanwhile, as illustrated in FIG. 2, the active barrier section ABU1 includes the p type semiconductor layers (PR1A, PR1B and PR1C) electrically connected to the semiconductor substrate 1S to which the ground potential is applied, and the p type semiconductor layers are electrically connected to the n type semiconductor layers via the plugs (PLG1A and PLG1B) and the wiring WL1. Accordingly, the electrons flow into the n type semiconductor layer of the active barrier section ABU1, and holes flow in a path from the semiconductor substrate 1S through the p type semiconductor layer, the plug PLG1B, the wiring WL1 and the plug PLG1A to the n type semiconductor layer. Then, the electrons and the holes are recombined in the n type semiconductor layer. At this time, a potential of the p type semiconductor layer becomes a negative potential in the active barrier section ABU1 when considering that the current flows from the semiconductor substrate 1S through the p type semiconductor layer to the n type semiconductor layer and the semiconductor substrate 1S is fixed to the ground potential (0 V). As a result, a negative potential is generated as a potential around the p type semiconductor layer. Consequently, the electrons injected into the semiconductor substrate 1S are hindered from advancing to the circuit unit CT present after the active barrier section ABU1 due to the negative potential generated around the p type semiconductor layer. Namely, since the electrons have the negative charge, the negative potential generated around the p type semiconductor layer becomes a potential barrier for the electrons, and the injection of electrons into the circuit unit CT is suppressed. Accordingly, the unintended injection of electrons from the output unit OT1 into the circuit unit CT is suppressed by providing the active barrier section ABU1 between the output unit OT1 and the circuit unit CT, and it is thus possible to suppress the malfunction in the device constituting the circuit unit CT. In particular, it is important to provide the p type semiconductor layer closer to the circuit unit CT than the n type semiconductor layer in the configuration of the active barrier section ABU1, and accordingly, it is possible to effectively suppress the injection of electrons into the circuit unit CT.

<Study for Improvement>

As described above, it is understood that the active barrier section ABU1 is useful from a viewpoint of suppressing the unintended injection of electrons from the output unit OT1 into the circuit unit CT. Meanwhile, the inventor of the present invention has conducted a study regarding the configuration of the active barrier section ABU1, and has newly found out that it is necessary to conduct a study for improvement from a viewpoint of sufficiently suppressing the injection of electrons from the output unit OT1 into the circuit unit CT. Namely, the inventor of the present invention has newly found out that there is a case in which the injection of electrons into the circuit unit CT conversely increases depending on conditions in the above-described active barrier section ABU1, and has devised a method capable of suppressing the injection of electrons into the circuit unit CT based on the findings. Hereinafter, the new findings that have been found out by the inventor of the present invention will be first described, and then a technical idea of the first embodiment that has been derived based on the findings will be described.

Figure 3:
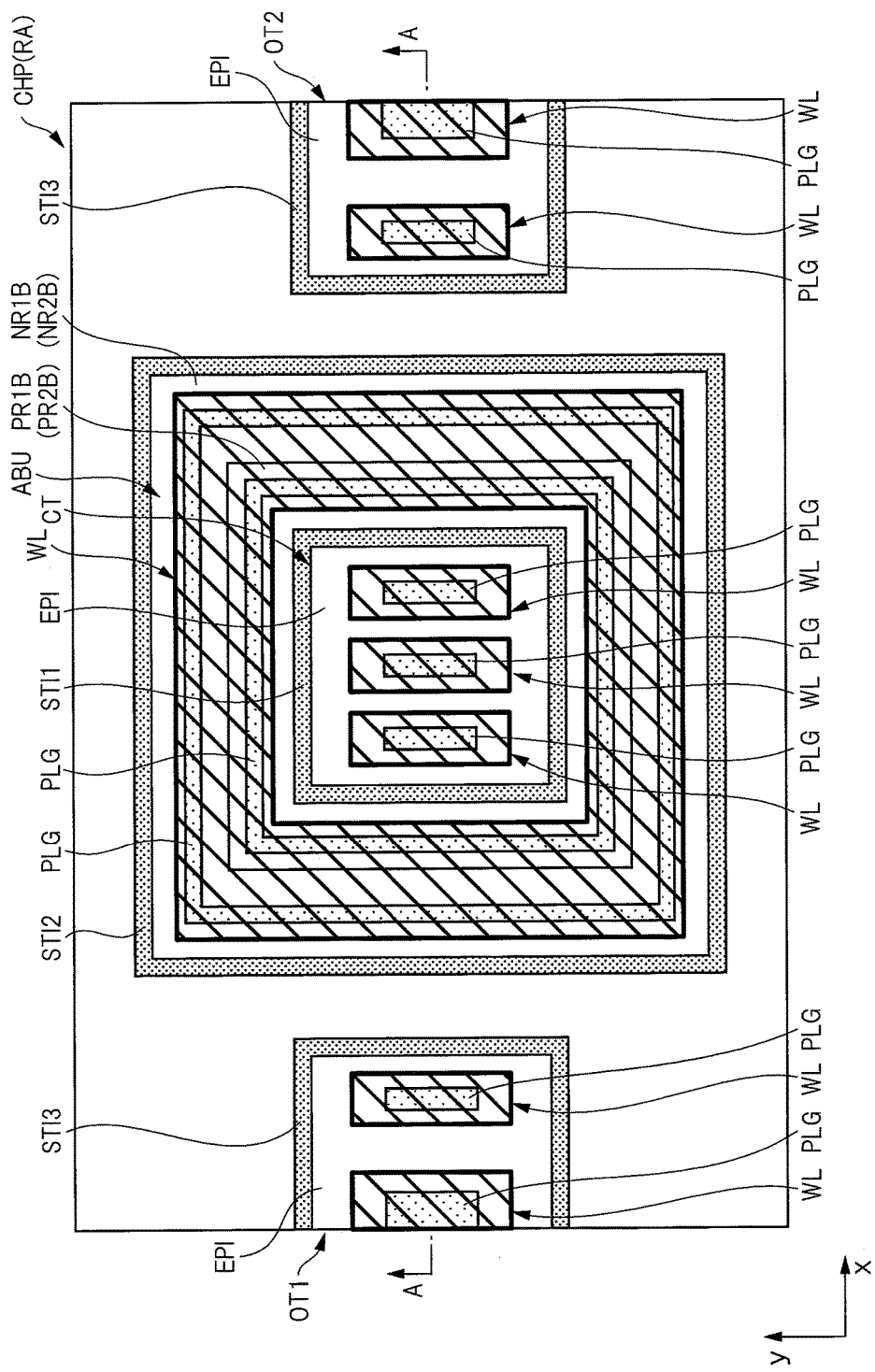
FIG. 3 is a schematic plan view illustrating a planar layout of a semiconductor chip according to a related art.

FIG. 3 is a schematic plan view illustrating a planar layout of a semiconductor chip CHP (RA) according to a related art. Note that the "related art" referred in the present specification is a technique which has a problem that has been newly found out by the inventor, and is not a publicly known conventional technique, but is a technique that is described with an intention for a premised technique of a novel technical idea (non-publicly-known technique).

In FIG. 3, the semiconductor chip CHP (RA) according to the related art includes a circuit unit CT having a rectangular shape at a central portion thereof, and a wiring WL is connected to the circuit unit CT illustrated in FIG. 3 via an epitaxial layer EPI and a plug PLG. Further, an isolation section STI1 is formed in the semiconductor chip CHP (RA) so as to surround the circuit unit CT, and further, an active barrier section ABU is formed so as to surround the circuit unit CT with the isolation section STI1 interposed therebetween. FIG. 3 illustrates a p type semiconductor layer PR1B (PR2B) and an n type semiconductor layer NR1B (NR2B) serving as components of the active barrier section ABU, and the wiring WL which is electrically connected to the p type semiconductor layer PR1B (PR2B) and the n type semiconductor layer NR1B (NR2B) via the plug PLG. In addition, an isolation section STI2 that surrounds the active barrier section ABU is formed in the semiconductor chip CHP (RA). Further, an output unit OT1 and an output unit OT2 are formed in the semiconductor chip CHP (RA) so as to be spaced apart from each other and to sandwich the active barrier section ABU surrounded by the isolation section STI2 in an x direction. Each of the output unit OT1 and the output unit OT2 is surrounded by an isolation section STI3, and FIG. 3 illustrates the wiring WL connected to the epitaxial layer EPI via the plug PLG.

Note that a cross-sectional view taken along a line A-A of FIG. 3 is basically similar to the cross-sectional view of the semiconductor chip CHP1 according to the first embodiment illustrated in FIG. 2. However, since the active barrier section is formed in an integrated manner in the related art, the active barrier section is illustrated as the "active barrier section ABU" in FIG. 3 by denoting it with the same reference character as those of the active barrier section ABU1 and the active barrier section ABU2 illustrated in FIG. 2. Further, since the "active barrier section ABU" is formed in the integrated manner in the related art illustrated in FIG. 3, the p type semiconductor layer PR1B and the p type semiconductor layer PR2B illustrated in FIG. 2 become the same components, and the n type semiconductor layer NR1B and the n⁻ type semiconductor layer NR2B become the same components. The planar layout of the semiconductor chip CHP (RA) according to the related art is configured in the above-described manner.

Here, according to the study by the inventor of the present invention, there is room for improvement in the planar layout configuration of the semiconductor chip CHP (RA) according to the related art illustrated in FIG. 3, and thus, such a room for improvement in the related art will be described below.

For example, a case in which a negative potential is applied to the epitaxial layer EPI (drain) inside the output unit OT1 formed in the output unit formation region OTR1 illustrated in FIG. 2 due to a back electromotive force caused by the inductance L illustrated in FIG. 1, so that a forward bias is applied to the pn junction between the epitaxial layer EPI inside the output unit OT1 and the semiconductor substrate 1S will be considered. In this case, electrons are injected from the epitaxial layer EPI inside the output unit OT1 into the semiconductor substrate 1S, and the electrons injected into the semiconductor substrate 1S enter the n type semiconductor layer (the n⁺ type semiconductor layer NR1A, the n⁻ type semiconductor layer NR1B and the n⁺ type semiconductor layer NR1C) of the active barrier section ABU1 (ABU). At this time, holes are injected in a path from the semiconductor substrate 1S through the p type semiconductor layer (the p⁺ type semiconductor layer PR1A, the p type semiconductor layer PR1B and the p⁺ type semiconductor layer PR1C), the plug PLG1B, the wiring WL1 and the plug PLG1A to the n type semiconductor layer, and the holes and the electrons are combined inside the n type semiconductor layer in the active barrier section ABU1 (ABU). Accordingly, when the injection of the electrons from the output unit OT1 into the active barrier section ABU1 (ABU) increases, the amount of holes to be required for combination with the electrons increases, and thus a current flowing in the path from the semiconductor substrate 1S through the p type semiconductor layer, the plug PLG1B, the wiring WL1 and the plug PLG1A to the n type semiconductor layer increases. This increase of the current means an increase of an absolute value of the negative potential generated in the active barrier section ABU1 (ABU). Further, since the active barrier section ABU1 (ABU) and the active barrier section ABU2 (ABU) are electrically connected to each other in the related art as illustrated in FIGS. 2 and 3, a negative potential having a large absolute value is applied also to the active barrier section ABU2 (ABU). As a result, since the negative potential having the large absolute value is applied to the n type semiconductor layer (the n⁺ type semiconductor layer NR1A, the n type semiconductor layer NR1B and the n⁺ type semiconductor layer NR1C) of the active barrier section ABU2 (ABU) and the ground potential is supplied to the semiconductor substrate 1S in FIG. 2, the forward bias is applied to the pn junction between the n type semiconductor layer of the active barrier section ABU2 (ABU) and the semiconductor substrate 1S. In particular, when the absolute value of the negative potential increases and the forward bias exceeding a built-in potential (having an absolute value of about 0.7 V) of the pn junction is applied, a large amount of electrons are injected from the n type semiconductor layer of the active barrier section ABU2 (ABU) into the semiconductor substrate 1S. Accordingly, the electrons which have been injected from the active barrier section ABU2 (ABU) into the semiconductor substrate 1S enter the circuit unit CT, and thus the malfunction is more likely to occur in the circuit unit CT.

A case in which the amount of electrons injected from the output unit OT1 into the semiconductor substrate 1S is larger than the amount of electrons injected from the output unit OT2 into the semiconductor substrate 1S in the related art, for example, in FIG. 2 will be considered. In this case, the injection of electrons from the output unit OT1 into the circuit unit CT can be suppressed by the active barrier section ABU1 (ABU) and the injection of electrons from the output unit OT2 into the circuit unit CT can be suppressed by the active barrier section ABU2 (ABU). However, when the amount of electrons injected from the output unit OT1 into the semiconductor substrate 1S is too large, the absolute value of the negative potential generated in the active barrier section ABU1 (ABU) increases, and accordingly, the absolute value of the negative potential to be applied to the active barrier section ABU2 (ABU), which is electrically connected to the active barrier section ABU1 (ABU), increases. As a result, injection of electrons from the active barrier section ABU2 (ABU) into the semiconductor substrate 1S is newly caused, and unintended injection of electrons into the circuit unit CT conversely increases due to the injection of the electrons from the active barrier section ABU2 (ABU). Namely, a case in which the amount of electrons injected from the output unit OT1 into the semiconductor substrate 1S is too large, for example, in the related art will be considered. In this case, the direct entering of electrons into the circuit unit CT can be suppressed by the active barrier section ABU1 (ABU) which is arranged on the side close to the injection source in the related art. On the other hand, the indirect entering of electrons into the circuit unit CT from the active barrier section ABU2 (ABU) which is arranged on the side far from the injection source is newly caused in the related art (new findings). As a result, the malfunction of the circuit unit CT is likely to occur due to the newly caused injection of electrons from the active barrier section ABU2 (ABU) into the circuit unit CT. In this regard, there is room for improvement in the related art.

Thus, the first embodiment has been devised in order to eliminate the room for improvement in the related art. Hereinafter, a technical idea of the first embodiment that has been devised for this purpose will be described with reference to the drawings.

<Device Structure (Planar Structure) of Semiconductor Chip>

Figure 4:
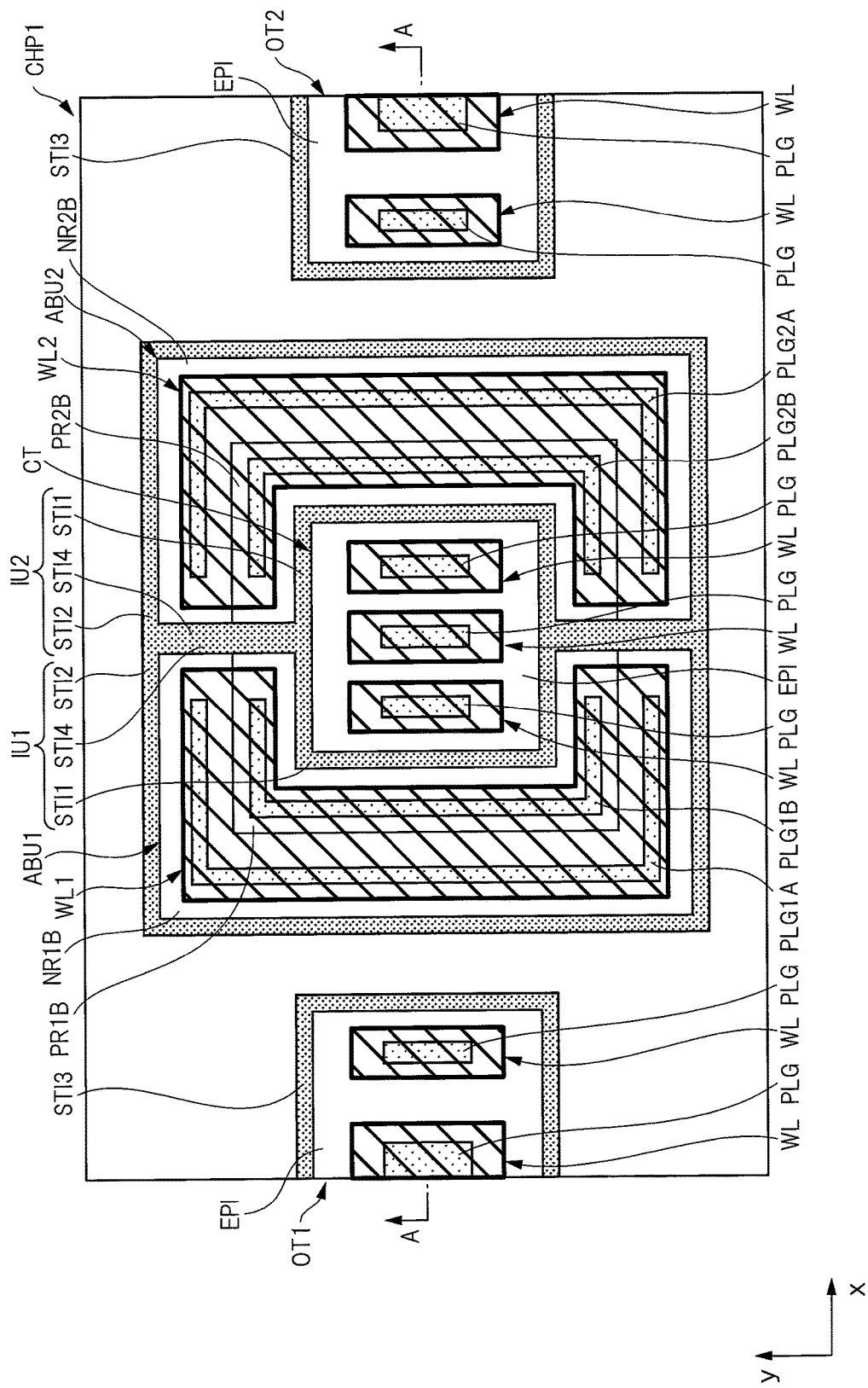
FIG. 4 is a plan view schematically illustrating a planar layout of the semiconductor chip according to the first embodiment.

FIG. 4 is a plan view schematically illustrating a planar layout of the semiconductor chip CHP1 according to the first embodiment. In FIG. 4, the semiconductor chip CHP1 according to the first embodiment includes the circuit unit CT having a rectangular shape at a central portion thereof, and the wiring WL is connected to the circuit unit CT illustrated in FIG. 4 via the epitaxial layer EPI and the plug PLG. In addition, the isolation section STI1 is formed in the semiconductor chip CHP1 so as to surround the circuit unit CT. Further, as illustrated in FIG. 4, the output unit OT1 and the output unit OT2 are arranged so as to be spaced apart from each other and to sandwich the circuit unit CT surrounded by the isolation section STI1 in the x direction when seen in a plan view. Each of the output unit OT1 and the output unit OT2 is surrounded by the isolation section STI3, and FIG. 4 illustrates the wiring WL connected to the epitaxial layer EPI via the plug PLG.

Further, the semiconductor chip CHP1 according to the first embodiment includes an element isolation section IU1 which is provided between the output unit OT1 and the circuit unit CT when seen in a plan view and is configured of a closed pattern as illustrated in FIG. 4. In addition, the semiconductor chip CHP1 according to the first embodiment includes an element isolation section IU2 which is provided between the output unit OT2 and the circuit unit CT and is configured of a closed pattern. Specifically, the element isolation section IU1 forms the closed pattern made up of the isolation section STI1, the isolation section STI2 and an isolation section STI4, and similarly, the element isolation section IU2 forms the closed pattern made up of the isolation section STI1, the isolation section STI2 and the isolation section STI4 as illustrated in FIG. 4. At this time, the element isolation section IU1 and the element isolation section IU2 share the isolation section STI4, and the circuit unit CT is surrounded by the element isolation section IU1 and the element isolation section IU2 when seen in a plan view. Further, the semiconductor chip CHP1 according to the first embodiment includes the active barrier section ABU1 which is enclosed by the element isolation section IU1 and the active barrier section ABU2 which is enclosed by the element isolation section IU2 when seen in a plan view. Since the active barrier section ABU1 is surrounded by the element isolation section IU1 configured of the closed pattern and the active barrier section ABU2 is surrounded by the element isolation section IU2 configured of the closed pattern in this manner in the semiconductor chip CHP1 according to the first embodiment, the active barrier section ABU1 and the active barrier section ABU2 are electrically isolated from each other. FIG. 4 illustrates the p type semiconductor layer PR1B and the n⁻ type semiconductor layer NR1B serving as components of the active barrier section ABU1, and the wiring WL1 which is electrically connected to the p type semiconductor layer PR1B and the n type semiconductor layer NR1B via the plug PLG1A and the plug PLG1B. Similarly, FIG. 4 illustrates the p type semiconductor layer PR2B and the n⁻ type semiconductor layer NR2B serving as components of the active barrier section ABU2, and the wiring WL2 which is electrically connected to the p type semiconductor layer PR2B and the n type semiconductor layer NR2B via the plug PLG2A and the plug PLG2B.

Here, a planar size of the wiring WL1 and a planar size of the wiring WL2 are made equal to each other, for example, as illustrated in FIG. 4. In other words, a planar size of the active barrier section ABU1 surrounded by the element isolation section IU1 and a planar size of the active barrier section ABU2 surrounded by the element isolation section IU2 are made equal to each other. Further, the wiring WL1 and the wiring WL2 are arranged to be symmetrical with respect to the circuit unit CT when seen in a plan view. In other words, the active barrier section ABU1 and the active barrier section ABU2 are arranged to be symmetrical with respect to the circuit unit CT when seen in a plan view. However, the planar size of the active barrier section ABU1 and the planar size of the active barrier section ABU2 according to the first embodiment are not limited to the case of being equal to each other, and the active barrier section ABU1 and the active barrier section ABU2 may be configured to have different planar sizes from each other. Namely, it is also possible to arrange the active barrier section ABU1 and the active barrier section ABU2 to be asymmetrical with respect to the circuit unit CT. In this case, the wiring WL1 and the wiring WL2 are inevitably arranged to be asymmetrical to each other.

Characteristic of First Embodiment

Subsequently, a characteristic point of the first embodiment will be described. The characteristic point of the first embodiment is that the active barrier section ABU1 and the active barrier section ABU2 are electrically isolated from each other, for example, as illustrated in FIG. 4. Specifically, as illustrated in FIG. 4, the active barrier section ABU1 is enclosed by the element isolation section IU1 configured of the closed pattern, and the active barrier section ABU2 is enclosed by the element isolation section IU2 configured of the closed pattern. As a result, it is possible to electrically isolate the active barrier section ABU1 from the active barrier section ABU2 according to the first embodiment. Accordingly, it is possible to suppress the malfunction due to the entering of electrons into the circuit unit CT according to the first embodiment.

For example, the injection of electrons from the output unit OT1 into the circuit unit CT can be suppressed by the active barrier section ABU1 (ABU) and the injection of electrons from the output unit OT2 into the circuit unit CT can be suppressed by the active barrier section ABU2 (ABU) also in the related art when the amount of electrons injected from the output unit OT1 into the semiconductor substrate 1S is larger than the amount of electrons injected from the output unit OT2 into the semiconductor substrate 1S. However, since the active barrier section ABU1 (ABU) and the active barrier section ABU2 (ABU) are electrically connected to each other in the related art, the following disadvantage occurs. That is, the absolute value of the negative potential generated in the active barrier section ABU1 (ABU) increases when the amount of electrons injected from the output unit OT1 into the semiconductor substrate 1S is too large in FIG. 2, and accordingly, the absolute value of the negative potential to be applied to the active barrier section ABU2 (ABU), which is electrically connected to the active barrier section ABU1 (ABU), increases. Consequently, the pn junction between the n type semiconductor layer of the active barrier section ABU2 (ABU) and the semiconductor substrate 1S is forward biased, and the injection of electrons from the active barrier section ABU2 (ABU) into the semiconductor substrate 1S is newly caused. As a result, the unintended injection of electrons into the circuit unit CT conversely increases due to the injection of electrons from the active barrier section ABU2 (ABU) in the related art. Namely, the active barrier section ABU1 (ABU) and the active barrier section ABU2 (ABU) are electrically connected to each other in the related art. As a result, when the amount of electrons injected from the output unit OT1 into the semiconductor substrate 1S is too large in the related art, for example, the indirect entering of the electrons into the circuit unit CT from the active barrier section ABU2 (ABU), which is arranged on the side far from the injection source, is newly caused while the direct entering of the electrons into the circuit unit CT can be suppressed by the active barrier section ABU1 (ABU) which is arranged on the side close to the injection source. Accordingly, the malfunction of the circuit unit CT is likely to occur due to the newly caused injection of electrons from the active barrier section ABU2 (ABU) into the circuit unit CT in the related art.

On the contrary, the active barrier section ABU1 and the active barrier section ABU2 are electrically isolated from each other in the first embodiment, for example, as illustrated in FIG. 4. In the first embodiment, for example, even when the amount of electrons injected from the output unit OT1 into the semiconductor substrate 1S is too large and the absolute value of the negative potential generated in the active barrier section ABU1 (ABU) increases in FIG. 2, the active barrier section ABU1 and the active barrier section ABU2 are electrically isolated from each other. As a result, the potential to be applied to the active barrier section ABU2 is not affected by the negative potential having the large absolute value which is generated in the active barrier section ABU1. Accordingly, the pn junction between the n type semiconductor layer of the active barrier section ABU2 and the semiconductor substrate 1S is not forward biased, and the injection of electrons from the active barrier section ABU2 into the semiconductor substrate 1S does not occur. Accordingly, in the first embodiment, it is possible to prevent the increase of the unintended injection of electrons into the circuit unit CT, which is conversely caused due to the newly caused injection of electrons from the active barrier section ABU2. Namely, according to the characteristic point of the first embodiment, since the active barrier section ABU1 and the active barrier section ABU2 are electrically insulated from each other, it is possible to suppress the side effect of the indirect entering of electrons into the circuit unit CT from the active barrier section ABU2 which is arranged on the side far from the injection source even when the amount of electrons injected from the output unit OT1 into the semiconductor substrate 1S is too large. As a result, according to the characteristic point of the first embodiment, it is possible to prevent the side effect that becomes apparent when the amount of electrons injected from the output unit OT1 into the semiconductor substrate 1S is too large, and as a result, it is possible to suppress the malfunction of the circuit unit CT even under the condition where the injection amount of electrons from the injection source increases. As described above, according to the characteristic point of the first embodiment, it is possible to suppress the entering of electrons into the circuit unit CT basically regardless of the injection amount of electrons from the injection source, and as a result, it is possible to effectively suppress the malfunction of the circuit unit CT.

For example, when an inductance included in a load electrically connected to the output unit OT1 and an inductance included in a load electrically connected to the output unit OT2 are significantly different from each other in FIGS. 2 and 4, it is inevitable that the injection amount of electrons from the output unit OT1 and the injection amount of electrons from the output unit OT2 become significantly different from each other. In this case, it is difficult to effectively suppress the entering of electrons into the circuit unit CT due to the above-described side effect in the related art. On the contrary, it is possible to prevent the above-described side effect according to the first embodiment unlike the related art, and thus, the entering of electrons into the circuit unit CT can be effectively suppressed. Therefore, in the semiconductor device according to the first embodiment, it is possible to mitigate a restriction from a viewpoint of reliability (for example, a restriction in relation to the inductance) which is imposed between the load connected to the output unit OT1 and the load connected to the output unit OT2, and it is possible to improve the versatility of the semiconductor device according to the first embodiment. This means that it is possible to improve a degree of freedom in design of a system including a load by employing the semiconductor device according to the first embodiment.

As described above, according to the characteristic point of the first embodiment, it is possible to improve the reliability of the semiconductor device regardless of the injection amount of electrons from the injection source and the difference of the injection amount as a direct effect. This means that it is possible to connect the semiconductor device according to the first embodiment and various types of loads having an inductance while securing the reliability of the semiconductor device. Thus, according to the characteristic point of the first embodiment, it is possible to improve the versatility of the semiconductor device. Accordingly, the technical idea of the first embodiment has a useful technical significance in terms that it is possible to construct a highly reliable electrical system while expanding the degree of freedom in design of the electrical system by employing the semiconductor device according to the first embodiment.

Next, a point in which the fact that the unintended injection of the charge into the circuit unit CT, that is, the current flowing into the circuit unit CT can be reduced according to the characteristic point of the first embodiment is corroborated by simulation will be described.

Figure 5:
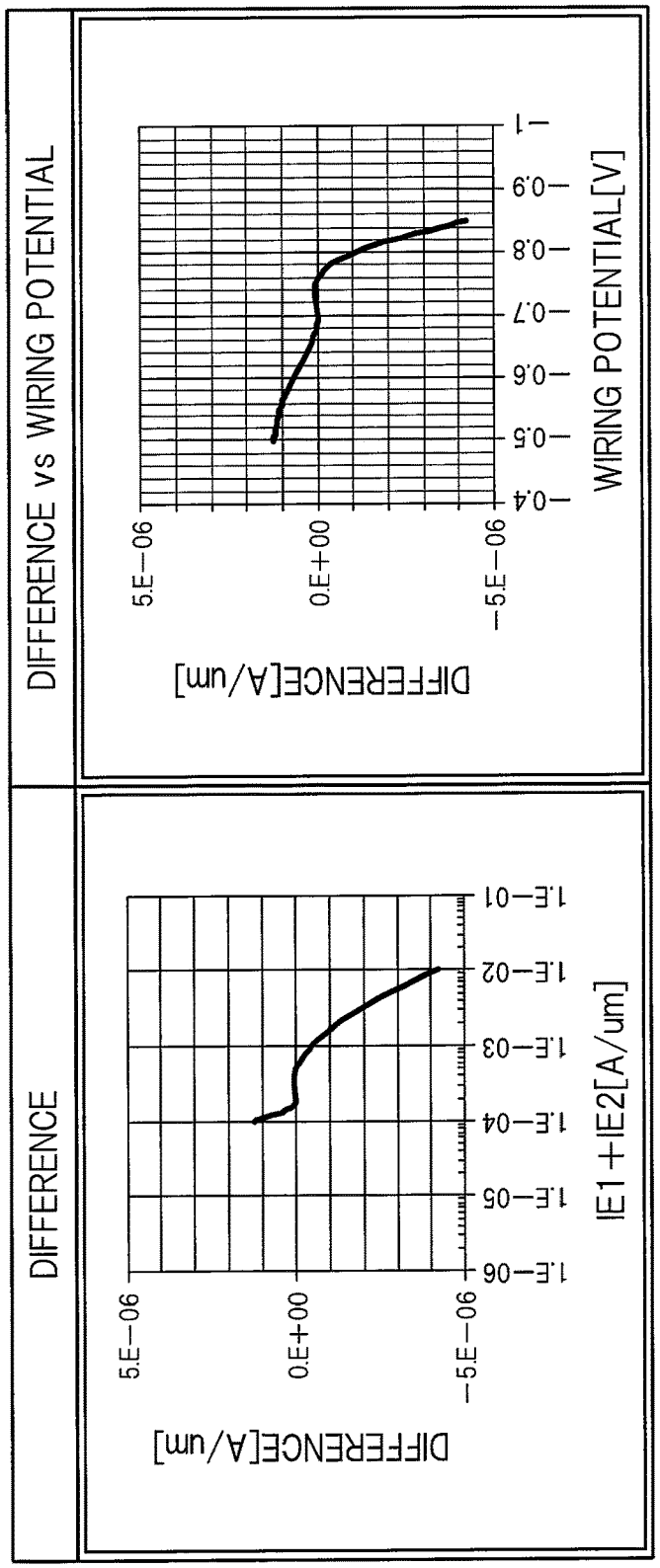
FIG. 5 is a graph illustrating simulation results.

FIG. 5 is a graph illustrating simulation results. First, conditions of simulation according to the first embodiment will be described. In FIG. 2, the output unit OT1 is set as an injection source 1, and the output unit OT2 is set as an injection source 2. Further, a current flowing in the output unit OT1 is set as a current IE1, and a current flowing in the output unit OT2 is set as a current IE2. At this time, the current IE2 is fixed to 0.1 mA, while the current IE1 is changed between 0.1 mA and 10 mA. Further, a current, which flows into the circuit unit CT in a configuration in which the active barrier section ABU1 and the active barrier section ABU2 are electrically isolated from each other (referred to as an isolated structure) in this condition, is set as a current I (isolated). In addition, a current, which flows into the circuit unit CT in a configuration in which the active barrier section ABU1 and the active barrier section ABU2 are electrically connected to each other (referred to as a connected structure), is set as a current I (common). At this time, a "difference" illustrated in FIG. 5 is defined as "current I (isolated)–current I (common)". Accordingly, for example, a case in which a value of the "difference" becomes a negative value means that the current I (isolated) becomes lower than the current I (common), and this means that the configuration of the first embodiment is superior to the configuration of the related art.

First, when the left diagram of FIG. 5 is viewed in consideration of the above-described point, it can be understood that the value of the "difference" is shifted to a negative value side as a sum of the current IE1 and the current IE2 increases. This indicates that it is corroborated that the isolated structure according to the first embodiment can reduce the current flowing into the circuit unit CT more than the connected structure according to the related art as the current IE2 is fixed to 0.1 mA and the current IE1 is increased from 0.1 mA to 10 mA, and the isolated structure according to the first embodiment is superior to the connected structure according to the related art.

Further, it can be understood that the absolute value of the negative potential of the wiring WL1 constituting the active barrier section ABU1 increases as the value of "difference" is shifted to the negative value side as illustrated in the right diagram of FIG. 5. Accordingly, it is possible to speculate the following point from the simulation results illustrated in the right and left diagrams of FIG. 5. For example, the reason why the value of "difference" is shifted to the negative value side as illustrated in the left diagram of FIG. 5 is that the side effect of the indirect injection of electrons into the circuit unit CT from the active barrier section ABU2, which is arranged on the side far from the injection source 1, is caused when a current value of the current IE1 increases in the connected structure of the related art, but the side effect is not caused in the isolated structure of the first embodiment. The basis of such speculation is because the potential of the wiring WL1 increases to a negative potential side when the value of "difference" is shifted to the negative value side as illustrated in the right diagram of FIG. 5.

Namely, when the potential of the wiring WL1 increases to the negative potential side, the potential of the wiring WL2 which is electrically connected to the wiring WL1 also increases to the negative potential side in the connected structure according to the related art. As a result, it is presumable that a forward bias (having an absolute value of about 0.7 V or larger) is applied to the pn junction between the active barrier section ABU2 and the semiconductor substrate 1S and the electrons are injected from the active barrier section ABU2 into the semiconductor substrate 1S in the related art. On the other hand, since the wiring WL2 is electrically isolated from the wiring WL1 in the isolated structure according to the first embodiment, the potential of the wiring WL2 does not increase to the negative potential side even if the potential of the wiring WL1 increases to the negative potential side, and accordingly, it is presumable that the injection of electrons from the active barrier section ABU2 into the semiconductor substrate 1S does not occur.

According to the above, it can be understood that the fact that the isolated structure according to the first embodiment can reduce the unintended injection of the charge into the circuit unit CT, that is, the current flowing into the circuit unit CT caused by the side effect even when the current IE1 flowing in the injection source 1 significantly increases in comparison with the current IE2 flowing in the other injection source 2 is corroborated by the evaluation results of the simulation illustrated in FIG. 5.

Note that the following advantage can be obtained in the configuration in which the planar size of the active barrier section ABU1 and the planar size of the active barrier section ABU2 are made equal, for example, as illustrated in FIG. 4. That is, it is possible to obtain the same effect even in a case in which a load having a large inductance is connected to either one of the output unit OT1 and the output unit OT2 serving as the injection source of electrons. In other words, it is possible to obtain the same effect in both a case in which the injection amount of electrons from the output unit OT1 is larger than the injection amount of electrons from the output unit OT2 and a case in which the injection amount of electrons from the output unit OT2 is larger than the injection amount of electrons from the output unit OT1.

Meanwhile, it is desirable that the planar size of the active barrier section ABU1 is made larger than the planar size of the active barrier section ABU2 in FIG. 4, for example, when it has been decided in design that the injection amount of electrons from the output unit OT1 is larger than the injection amount of electrons from the output unit OT2. This is because it is possible to increase the supply amount of holes for the pair annihilation with electrons by enlarging the planar size of the active barrier section ABU1 on the side close to the output unit OT1 from which the large amount of electrons are injected. Namely, this is because it is presumable that the pair annihilation between electrons and holes can be promoted by increasing a supply capability of the holes of the active barrier section ABU1 on the side close to the output unit OT1 from which the large amount of electrons are injected, and as a result, it is possible to increase the effect of suppressing the entering of electrons into the circuit unit CT. For the same reason, it is desirable that the planar size of the active barrier section ABU2 is made larger than the planar size of the active barrier section ABU1 in FIG. 4, for example, when it has been decided in design that the injection amount of electrons from the output unit OT2 is larger than the injection amount of electrons from the output unit OT1.

In addition, the power transistor QH constituting the high-side element and the power transistor QL constituting the low-side element illustrated in FIG. 1, for example, are formed in each of the output unit OT1 and the output unit OT2. At this time, it is the low-side element that particularly becomes the factor that causes the unintended injection of electrons into the circuit unit when a drain potential becomes lower than a source potential due to the back electromotive force during the dead time which is caused by the inductance included in the load. Namely, the power transistor QL serving as the low-side element illustrated in FIG. 1 mainly becomes a source of the unintended injection of electrons into the circuit unit. In this regard, it is desirable to arrange the low-side element to be farther from the circuit unit than the high-side element in each of the output unit OT1 and the output unit OT2, for example, from a viewpoint of reducing the influence on the circuit unit from the low-side element serving as the injection source of electrons. This is because it is presumable that it is possible to suppress the injection of electrons from the low-side element into the circuit unit by separating the low-side element serving as the injection source of electrons from the circuit unit as far as possible.

According to the above, it is possible to effectively suppress the unintended injection of electrons into the circuit unit by taking into consideration the above-described finding in relation to the planar sizes of the active barrier sections (ABU1 and ABU2) and the above-described finding in relation to the arrangement of the components of the output units (OT1 and OT2) together with the characteristic point of the first embodiment, and accordingly, it is possible to achieve the further improvement in reliability of the semiconductor device.

<Manufacturing Method of Semiconductor Device>

The semiconductor device according to the first embodiment is configured as described above, and a manufacturing method thereof will be described below with reference to the drawings.

Figure 6:
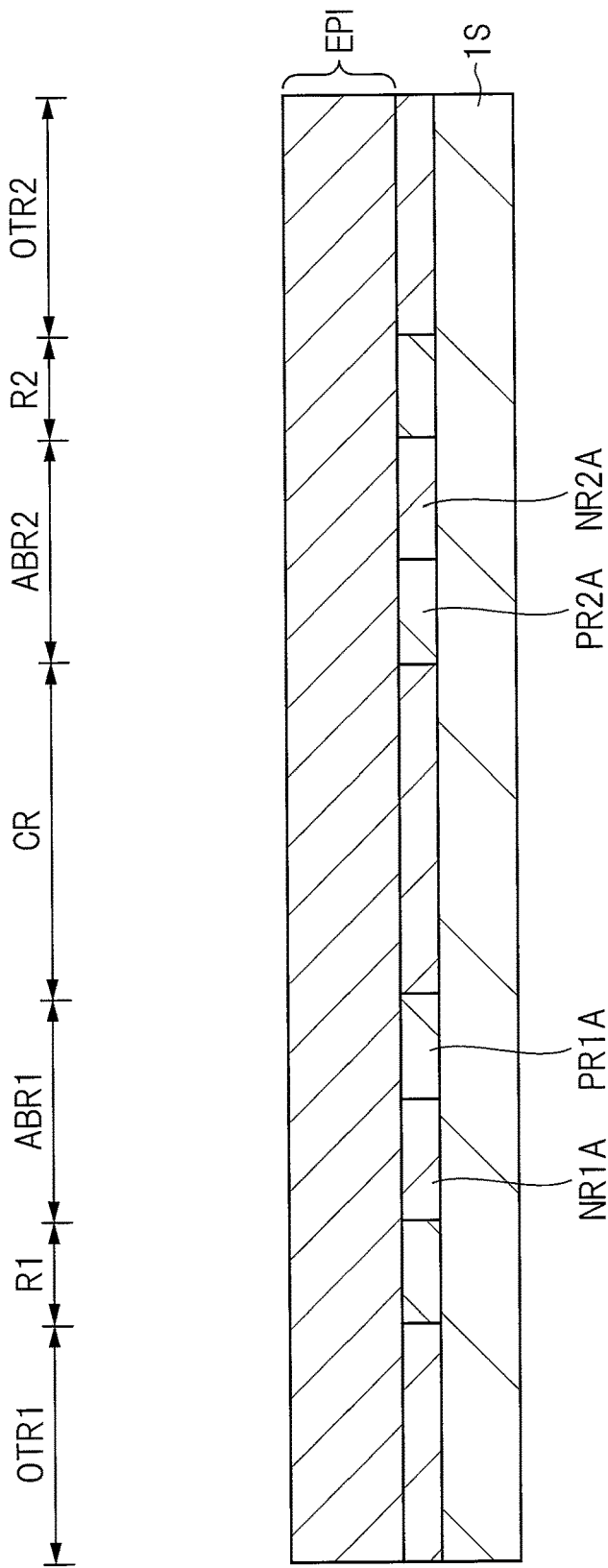
FIG. 6 is a cross-sectional view illustrating a manufacturing process of a semiconductor device according to the first embodiment.

First, as illustrated in FIG. 6, the semiconductor substrate 1S having a low p type impurity concentration is prepared, and then, a silicon oxide film having a thickness of about 300 nm to 1 μm is formed on a surface of the semiconductor substrate 1S. Further, a patterned resist film is formed on the silicon oxide film by a photolithography technique. Thereafter, the silicon oxide film is patterned by etching using the patterned resist film as a mask. Next, n type impurities (for example, antimony) are introduced into the surface of the semiconductor substrate 1S by an ion implantation method using the patterned silicon oxide film as a mask, and then, the patterned resist film is removed by ashing. Further, the semiconductor substrate 1S is subjected to heat treatment at about 1200° C. to form the $n^+$ type semiconductor layer (including the $n^+$ type semiconductor layer NR1A and the $n^+$ type semiconductor layer NR2A) inside the semiconductor substrate 1S. Thereafter, the patterned silicon oxide film, which has been formed on the semiconductor substrate 1S, is removed.

Subsequently, a silicon oxide film having a thickness of about 20 nm to 30 nm is formed on the surface of the semiconductor substrate 1S, and then, a patterned resist film is formed on the silicon oxide film by a photolithography technique. Further, the silicon oxide film is patterned by etching using the patterned resist film as a mask. Next, p type impurities (for example, boron) are introduced into the surface of the semiconductor substrate 1S by an ion implantation method using the patterned silicon oxide film as a mask, and then, the patterned resist film is removed by ashing. Further, the semiconductor substrate 1S is subjected to heat treatment at about 1150° C. to form the p$^+$ type semiconductor layer (including the p$^+$ type semiconductor layer PR1A and the p$^+$ type semiconductor layer PR2A) inside the semiconductor substrate 1S. Thereafter, the patterned silicon oxide film, which has been formed on the semiconductor substrate 1S, is removed. Thereafter, the epitaxial layer EPI serving as the n$^-$ type semiconductor layer is formed by an epitaxial growth technique on the semiconductor substrate 1S in which the n$^+$ type semiconductor layer and the p$^+$ type semiconductor layer have been formed.

Figure 7:
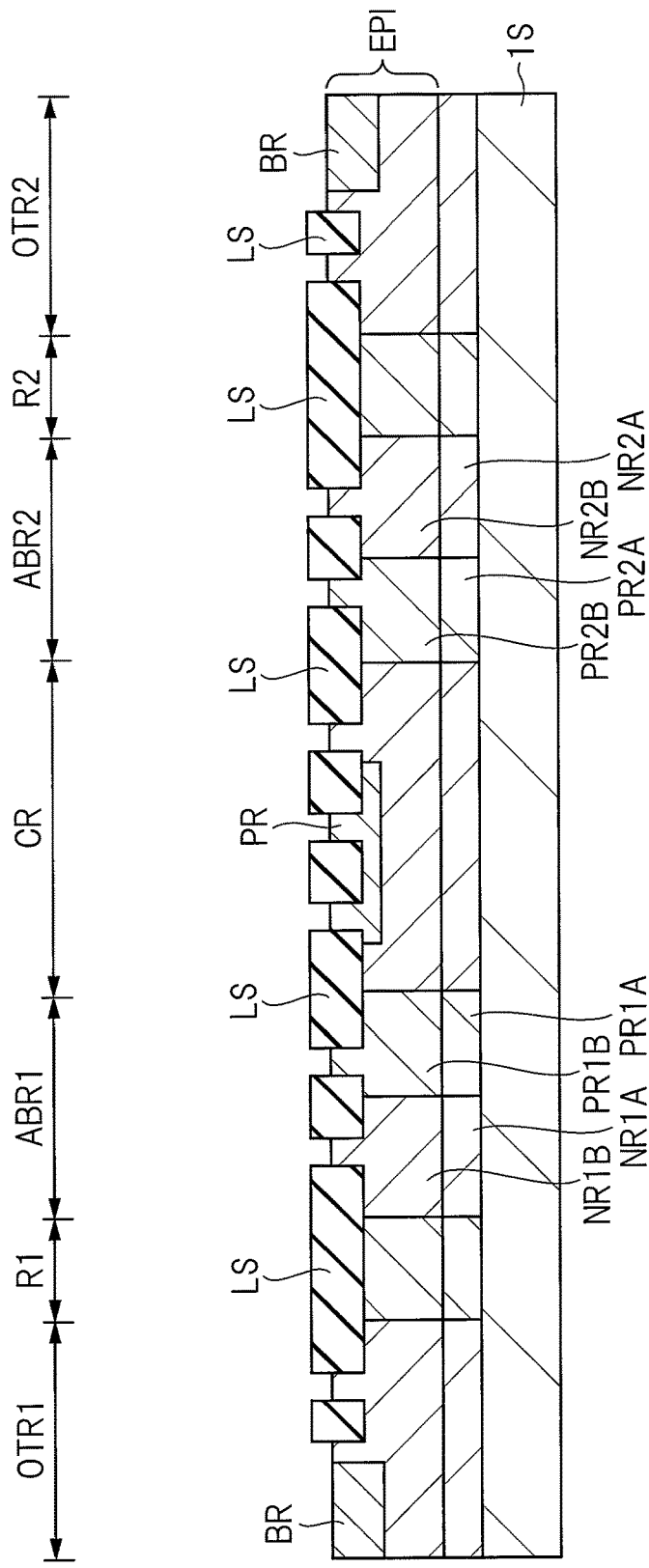
FIG. 7 is a cross-sectional view illustrating the manufacturing process of the semiconductor device continued from FIG. 6.

Next, as illustrated in FIG. 7, the surface of the epitaxial layer EPI is oxidized to form a silicon oxide film having a thickness of about 20 nm to 30 nm on the surface of the epitaxial layer EPI. Further, a patterned resist film is formed on the silicon oxide film by a photolithography technique. Subsequently, the silicon oxide film is patterned by etching using the patterned resist film as a mask, and then, the patterned resist film is removed by asking.

Subsequently, p type impurities (for example, boron) are introduced into the epitaxial layer EPI by an ion implantation method using the patterned silicon oxide film as a mask, thereby forming the p type semiconductor layer (including the p type semiconductor layer PR1B and the p type semiconductor layer PR2B) in the epitaxial layer EPI. Thereafter, a patterned resist film is formed on the surface of the epitaxial layer EPI by a photolithography technique. Further, p type impurities (for example, boron) are introduced into the epitaxial layer EPI with using the patterned resist film as a mask. Accordingly, the body region BR formed of the p type semiconductor region is formed in the output unit formation region OTR1 and the output unit formation region OTR2, and the p type semiconductor region PR is formed in the circuit unit formation region CR. At this time, the body region BR is a region to be a back gate of the power transistor constituting the output unit, and the p type semiconductor region PR is a region to be a base of the bipolar transistor constituting the circuit unit.

Further, after the silicon oxide film formed on the surface of the epitaxial layer EPI is removed, the LOCOS insulating film LS is selectively formed on the surface of the epitaxial layer EPI by a LOCOS method (selective oxidation method).

Figure 8:
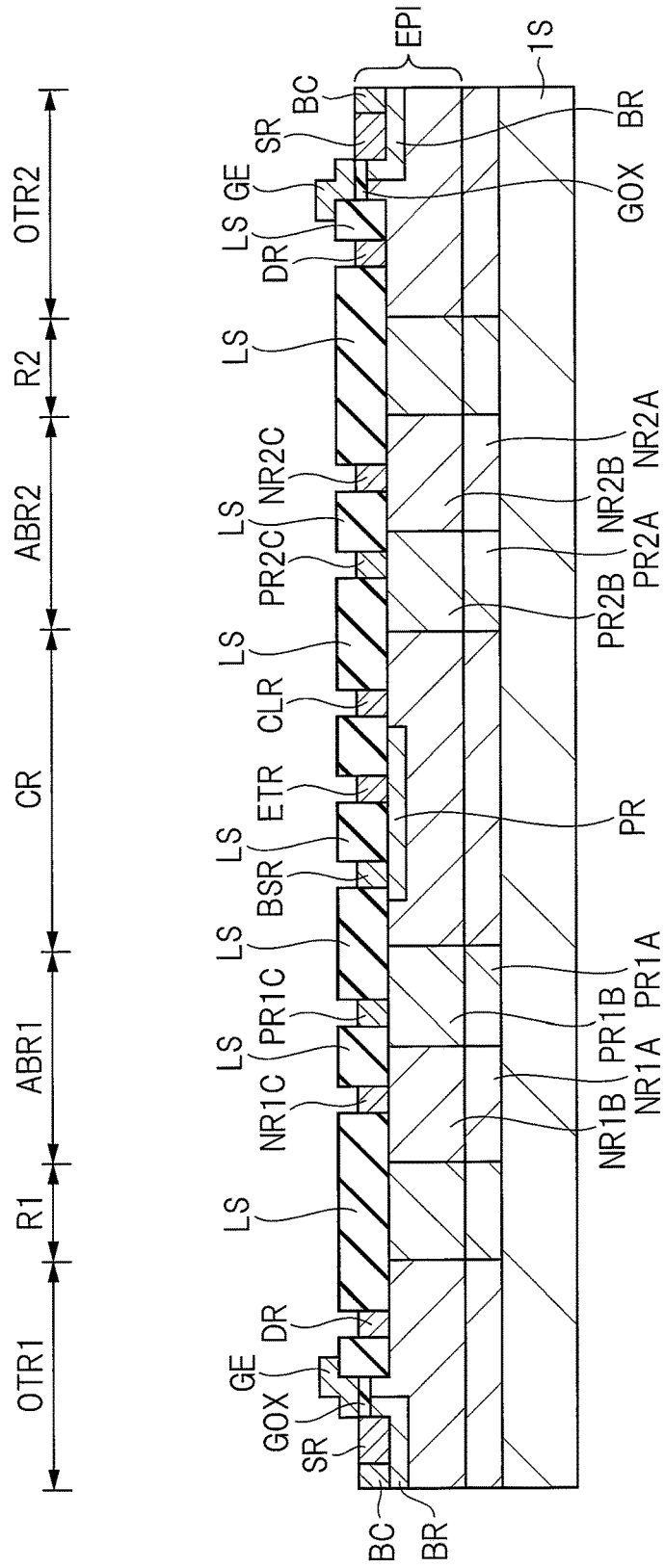
FIG. 8 is a cross-sectional view illustrating the manufacturing process of the semiconductor device continued from FIG. 7.

Next, as illustrated in FIG. 8, the gate insulating film GOX having a thickness of, for example, about several tens of nm is formed on the surface of the epitaxial layer EPI by a thermal oxidation method. Subsequently, a polysilicon film into which impurities having a conductivity type are introduced is formed on the epitaxial layer EPI. Further, the polysilicon film is patterned by a photolithography technique and etching, thereby forming the gate electrode GE of the power transistor constituting the output unit in each of the output unit formation region OTR1 and the output unit formation region OTR2.

Subsequently, a patterned resist film is formed on the surface of the epitaxial layer EPI by a photolithography technique. Thereafter, n type impurities (for example, arsenic) are introduced into the surface of the epitaxial layer EPI by an ion implantation method using the patterned resist film and the gate electrode GE as a mask. Accordingly, the source region SR and the drain region DR of the power transistor constituting the output unit are formed in each of the output unit formation region OTR1 and the output unit formation region OTR2. Similarly, the emitter region ETR and the collector region CLR of the bipolar transistor constituting the circuit unit are formed in the circuit unit formation region CR. In addition, the n$^+$ type semiconductor layer NR1C is formed in the active barrier region ABR1, and the n$^+$ type semiconductor layer NR2C is formed in the active barrier region ABR2. Thereafter, the patterned resist film is removed.

Next, a patterned resist film is formed on the surface of the epitaxial layer EPI by a photolithography technique. Further, p type impurities (for example, boron) are introduced into the surface of the epitaxial layer EPI by an ion implantation method using the patterned resist film and the gate electrode GE as a mask. Accordingly, the body contact region BC of the power transistor constituting the output unit is formed in each of the output unit formation region OTR1 and the output unit formation region OTR2. Similarly, the base region BSR of the bipolar transistor constituting the circuit unit is formed in the circuit unit formation region CR. In addition, the p$^+$ type semiconductor layer PR1C is formed in the active barrier region ABR1, and the p$^+$ type semiconductor layer PR2C is formed in the active barrier region ABR2. Thereafter, the patterned resist film is removed.

Figure 9:
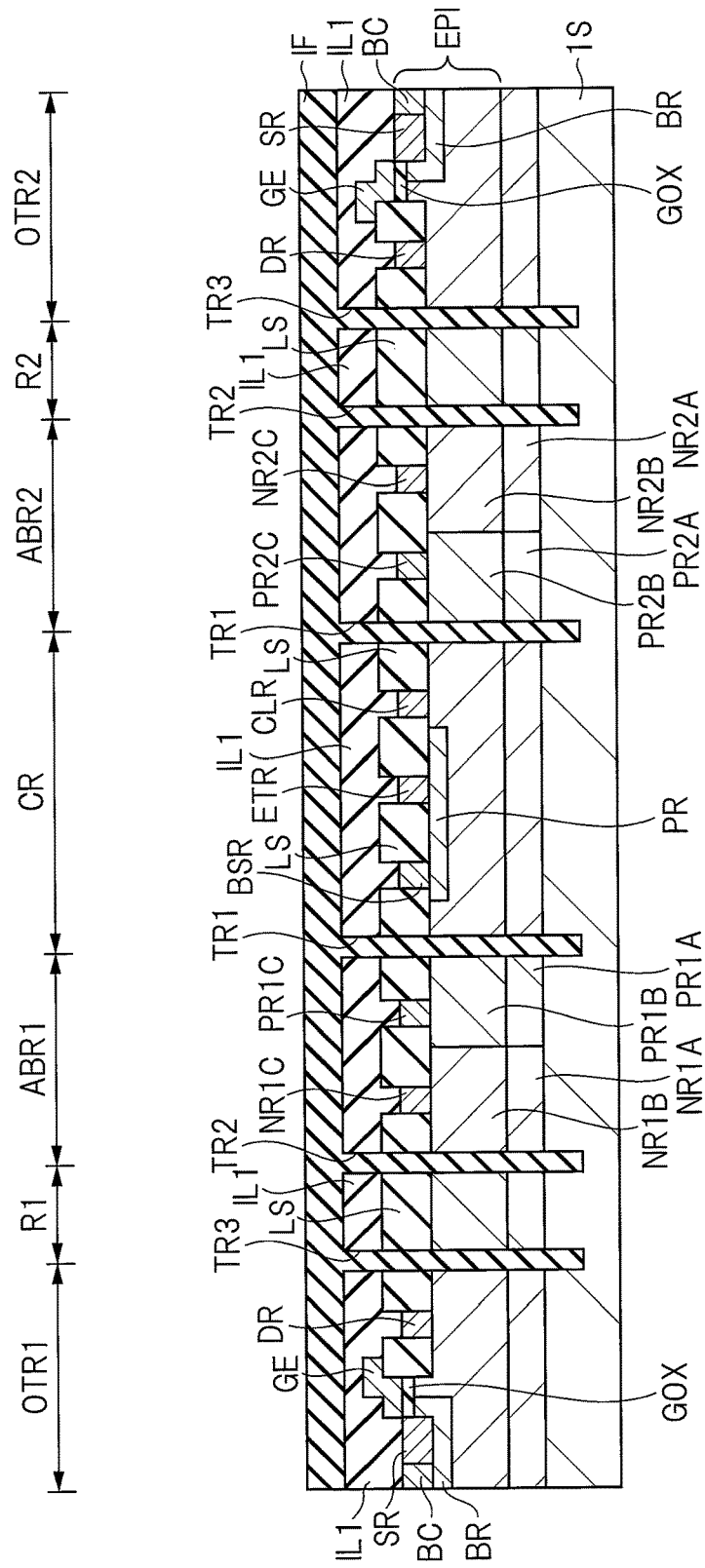
FIG. 9 is a cross-sectional view illustrating the manufacturing process of the semiconductor device continued from FIG. 8.

Subsequently, as illustrated in FIG. 9, a silicon oxide film having a thickness of about 500 nm to 1 μm is formed above the semiconductor substrate 1S, thereby forming the interlayer insulating film IL1. Thereafter, a patterned resist film is formed on the interlayer insulating film IL1 by a photolithography technique. Further, the interlayer insulating film IL1 and the LOCOS insulating film LS are etched with using the patterned resist film as a mask. Subsequently, the patterned resist film is removed, and then, the epitaxial layer EPI and the semiconductor substrate 1S are etched with using the etched interlayer insulating film IL1 as a mask. Accordingly, a trench TR1, a trench TR2 and a trench TR3 which penetrate the interlayer insulating film IL1, the LOCOS insulating film LS and the epitaxial layer EPI and reach the semiconductor substrate 1S are formed. Thereafter, an insulating film IF made of a silicon oxide film to be embedded inside the trenches TR1 to TR3 is formed on the interlayer insulating film IL. Further, the insulating film IF and the interlayer insulating film IL1 are polished to flatten each surface thereof by a chemical mechanical polishing (CMP) method until a thickness of the interlayer insulating film IL1 becomes about 500 nm to 1 μm. Accordingly, it is possible to form the isolation section STI1 (see FIG. 2) having a structure in which the insulating film IF is embedded into the trench TR1, the isolation section STI2 (see FIG. 2) having a structure in which the insulating film IF is embedded into the trench TR2, and the isolation section STI3 (see FIG. 2) having a structure in which the insulating film IF is embedded into the trench TR3.

Next, a patterned resist film is formed on the interlayer insulating film IL1 by a photolithography technique as illustrated in FIG. 2. Further, contact holes that penetrate the interlayer insulating film IL1 are formed with using the patterned resist film as a mask. Subsequently, a tungsten film is formed on the interlayer insulating film IL1 including the inside of the contact holes, and then, an unnecessary tungsten film that has been formed on the interlayer insulating film IL1 is removed by a CMP method. Accordingly, it is possible to form the plugs (including the plug PLG, the plug PLG1A, the plug PLG1B, the plug PLG2A and the plug PLG2B) in the interlayer insulating film IL1. Further, an aluminum film is formed on the interlayer insulating film IL1, and then, the aluminum film is patterned by a photolithography technique. Accordingly, it is possible to form the wirings (the wiring WL, the wiring WL1 and the wiring WL2) made of the patterned aluminum film. The semiconductor device according to the first embodiment can be manufactured in the above-described manner.

Modification Example

Figure 10:
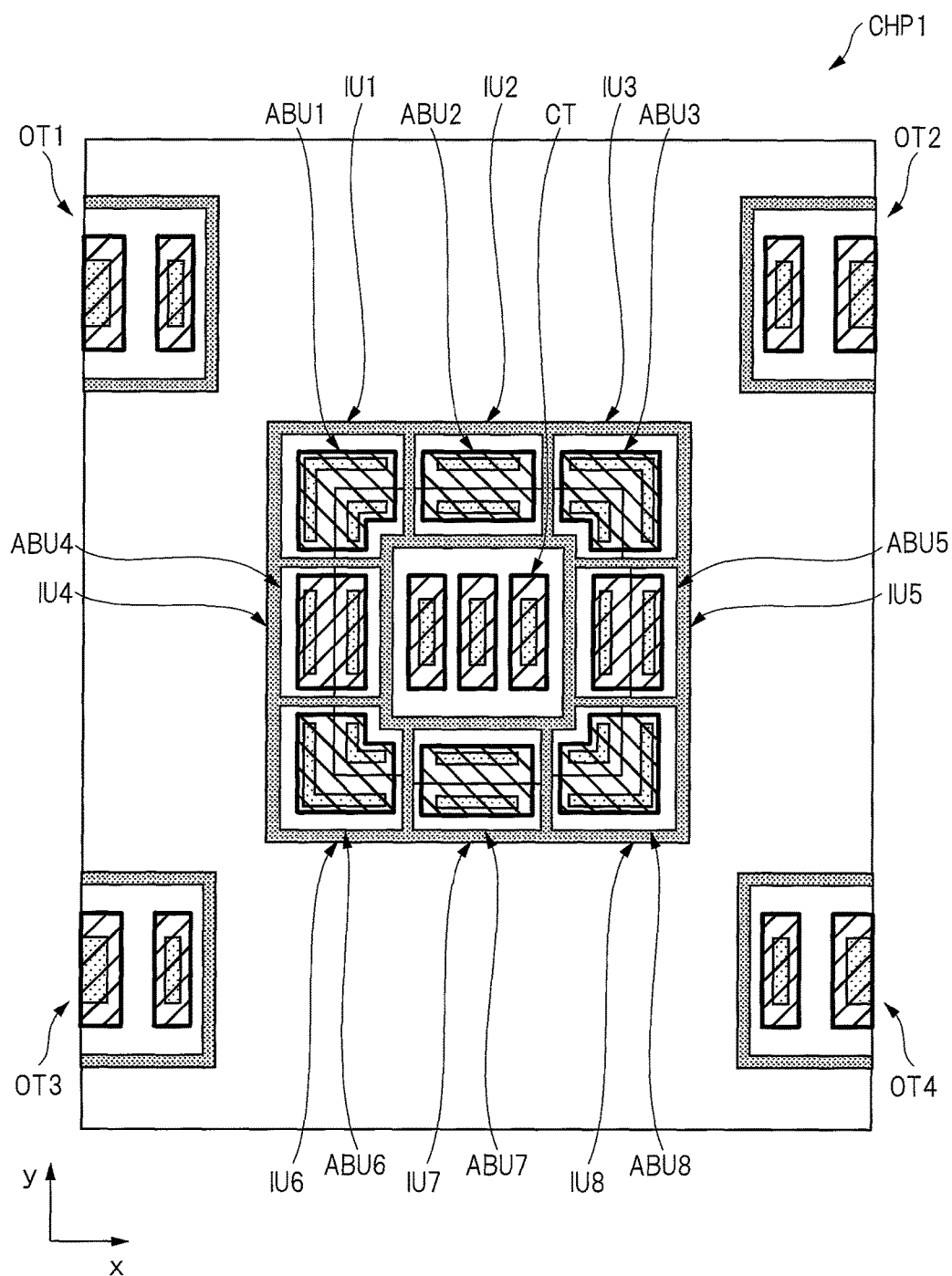
FIG. 10 is a plan view schematically illustrating a planar layout of a semiconductor chip according to a modification example of the first embodiment.

Subsequently, a modification example of the first embodiment will be described. FIG. 10 is a plan view schematically illustrating a planar layout of a semiconductor chip CHP1 according to the modification example. As illustrated in FIG. 10, the circuit unit CT is arranged at a central portion of the semiconductor chip CHP1, and four output units OT1 to OT4 are arranged near four corners of the semiconductor chip CHP1. Also in the modification example configured in this manner, for example, it is presumable that the injection amount of electrons from each of the four output units OT1 to OT4 into a semiconductor substrate increases when inductance included in each load connected to the four output units OT1 to OT4 significantly varies. Accordingly, it is advantageous to apply the technical idea of the first embodiment also to the semiconductor chip CHP1 according to this modification example. In this modification example, for example, element isolation sections IU1 to IU8 each of which is formed of a closed pattern are arranged to surround the circuit unit CT, and each of active barrier sections ABU1 to ABU8 is formed to be enclosed by each of the element isolation sections IU1 to IU8 as illustrated in FIG. 10. Thus, the eight active barrier sections ABU1 to ABU8 are electrically isolated from each other in this modification example. Accordingly, it is possible to suppress the entering of electrons into the circuit unit CT regardless of the injection amount of electrons from the four output units OT1 to OT4 serving as electron injection sources, and as a result, it is possible to effectively suppress the malfunction of the circuit unit CT also in this modification example. In particular, when the number of the plurality of active barrier sections (ABU1 to ABU8) is configured to be larger than the number of the plurality of output units (OT1 to OT4) as illustrated in FIG. 10, it is possible to prevent an adverse effect, which is caused when each injection amount of electrons from the plurality of output units (OT1 to OT4) significantly varies, from becoming apparent, and accordingly, it is possible to improve the reliability of the semiconductor device.

Second Embodiment

<Study for Improvement>

For example, according to the above-described characteristic point of the first embodiment in which each of the plurality of active barrier sections is formed to be enclosed by each of the plurality of element isolation sections so that the plurality of active barrier sections are electrically isolated from each other, it is possible to suppress the side effect, which is caused due to the difference in each injection amount of electrons from the plurality of output units serving as the electron injection source into the circuit unit. Namely, in the technical idea of the first embodiment, when the amount of electrons injected from a specific output unit into the semiconductor substrate is disproportionately large, an absolute value of a negative potential generated in an active barrier section arranged on a side close to the specific output unit increases. Then, if the active barrier section arranged on a side close to the output unit with the large injection amount of electrons and an active barrier section arranged on a side close to the output unit with the small injection amount of electrons are electrically connected to each other, for example, a negative potential having a large absolute value is applied also to the active barrier section arranged on the side close to the output unit with the small injection amount of electrons. In this case, particularly when the absolute value of the negative potential exceeds the built-in potential of the pn junction (having an absolute value of about 0.7 V in the case of silicon), the pn junction is forward biased and entering of electrons into the circuit unit is newly caused. In this regard, according to the above-described first embodiment, even if the absolute value of the negative potential generated in the active barrier section arranged on the side close to the output unit with the large injection amount of electrons increases, it is possible to suppress the negative potential having the large absolute value from being applied to the active barrier section which is arranged on the side close to the output unit with the small injection amount of electrons. As a result, it is possible to prevent the forward bias from being applied to the pn junction which is formed in the active barrier section arranged on the side close to the output unit with the small injection amount of electrons. Thus, the newly caused injection of electrons from the active barrier section arranged on the side close to the output unit with the small injection amount of electrons to the circuit unit can be prevented, and the malfunction of the circuit unit can be suppressed.

When focusing on the simulation results illustrated in FIG. 5, the "difference" is certainly shifted to the negative side when the wiring potential becomes lower than "−0.7 V" as illustrated in the left diagram of FIG. 5 and the right diagram of FIG. 5. This can be explained with the reason that the injection amount of electrons into the circuit unit increases when the pn junction in the active barrier section arranged on the side close to the output unit with the small injection amount of electrons is forward biased in the "connected structure" according to the related art. Further, the fact that the "difference" is shifted to the negative side means that the "isolated structure" according to the above-described first embodiment is superior to the "connected structure" according to the related art, and the usefulness of the technical idea of the above-described first embodiment is corroborated by FIG. 5.

Meanwhile, when the wiring potential is higher than "−0.7 V" in the right diagram of FIG. 5, the "difference" is conversely shifted to a positive side. This means that the "connected structure" according to the related art is conversely superior to the "isolated structure" according to the above-described first embodiment. Namely, it is suggested that the technical idea of the above-described first embodiment is useful only when the absolute value of the wiring potential is larger than the built-in potential of the pn junction, and the "connected structure" according to the related art is more useful than the "isolated structure" according to the above-described first embodiment in the case in which the absolute value of the wiring potential is smaller than the built-in potential of the pn junction.

This is because it is presumable that when the absolute value of the wiring potential does not exceed the built-in potential of the pn junction, it is possible to increase the size of the active barrier section more in the "connected structure", and accordingly, it is possible to increase the supply amount of holes to be combined with electrons, and as a result, the annihilation of electrons by the combination between the electrons and the holes is promoted and the injection of electrons into the circuit unit is suppressed.

Basic Idea of Second Embodiment

Then, a basic idea of the second embodiment is a technical idea that realizes the "connected structure" when the potential (absolute value) of the active barrier section does not exceed the built-in potential of the pn junction and realizes the "isolated structure" when the potential (absolute value) of the active barrier section exceeds the built-in potential of the pn junction. Namely, the basic idea of the second embodiment is the technical idea in which the "connected structure" and the "isolated structure" are switched depending on whether the potential (absolute value) of the active barrier section exceeds the built-in potential of the pn junction. According to the above-described basic idea of the second embodiment, it is possible to obtain the advantages of both the "connected structure" and the "isolated structure", and as a result, it is possible to further improve the reliability of the semiconductor device.

Configuration Example to Embody Basic Idea

Figure 11:
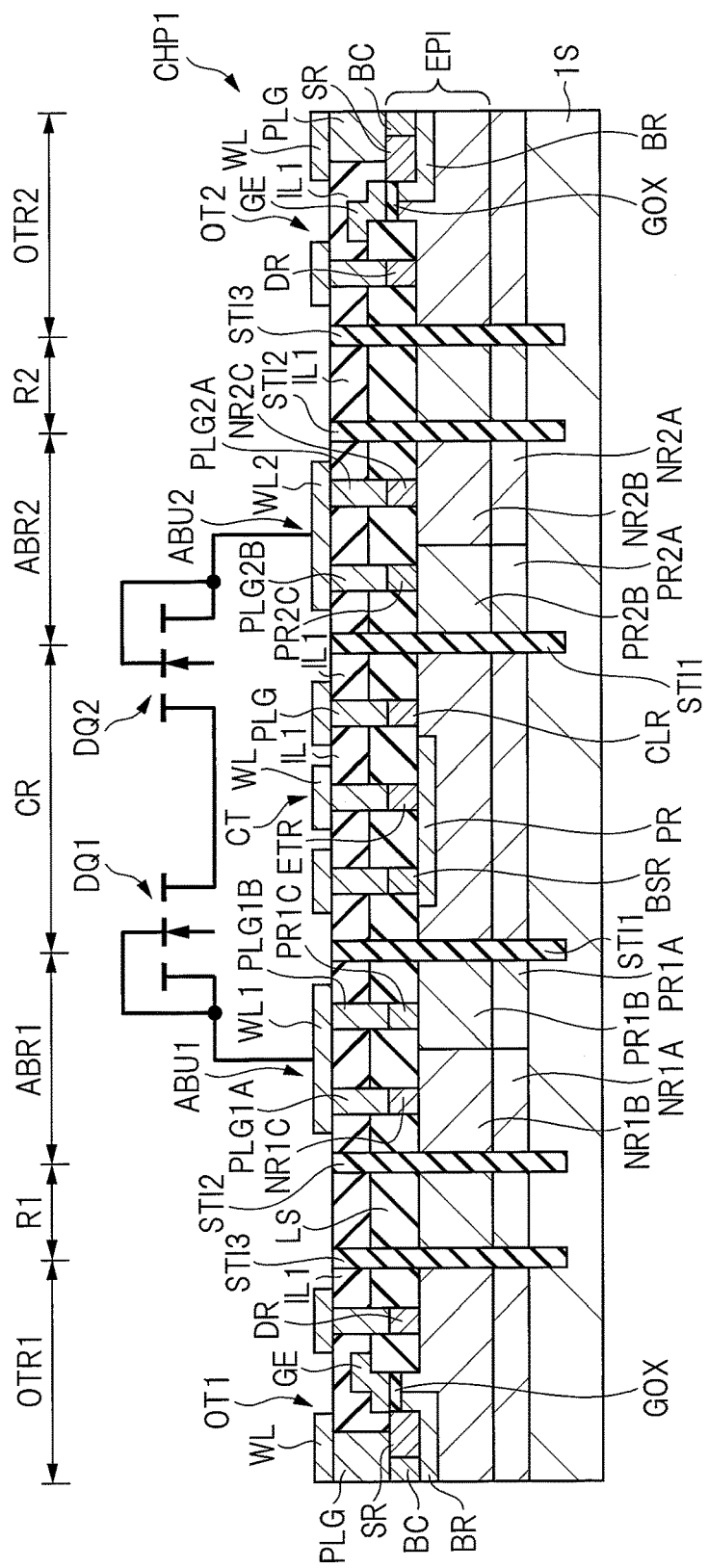
FIG. 11 is a diagram schematically illustrating a configuration example that embodies a basic idea of a second embodiment.

Hereinafter, a configuration example to embody the basic idea of the second embodiment will be described. FIG. 11 is a diagram schematically illustrating the configuration example that embodies the basic idea of the second embodiment. In FIG. 11, a characteristic point of this configuration example is that a depletion type field effect transistor DQ1 and a depletion type field effect transistor DQ2 connected to each other in series are provided between a wiring WL1 as a component of an active barrier section ABU1 and a wiring WL2 as a component of an active barrier section ABU2. Further, a gate electrode and a source of the depletion type field effect transistor DQ1 are electrically connected to each other, and a gate electrode and a source of the depletion type field effect transistor DQ2 are electrically connected to each other. Further, a threshold voltage (Vth) of the depletion type field effect transistor DQ1 is set to about "−0.7 V", and a threshold voltage (Vth) of the depletion type field effect transistor DQ1 is also set to about "−0.7 V".

According to the above-described configuration example, it is possible to embody the basic idea in which the "connected structure" and the "isolated structure" are switched depending on whether the potential (absolute value) of the active barrier section exceeds the built-in potential of the pn junction. Hereinafter, this point will be described.

Figure 12:
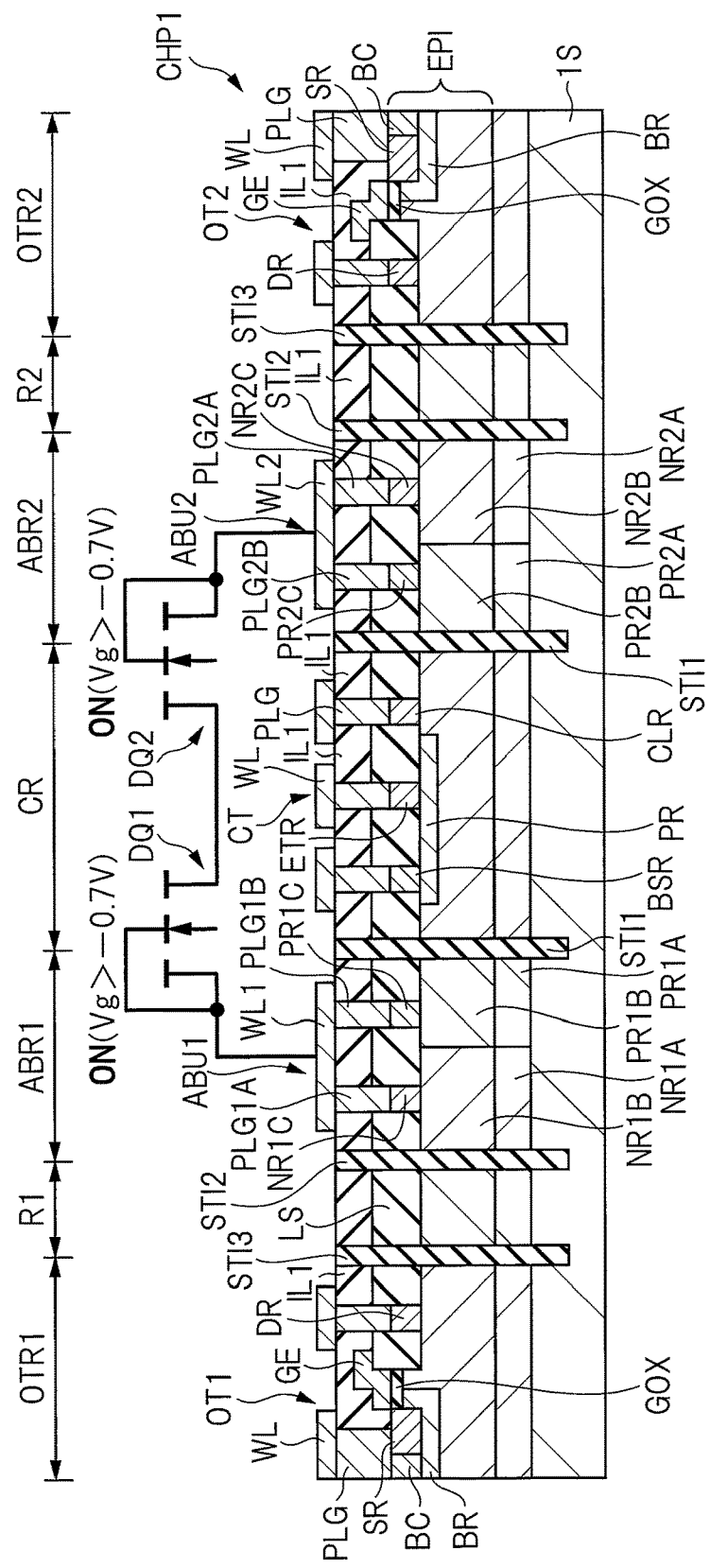
FIG. 12 is a diagram illustrating a case in which a potential of a wiring of a first active barrier section is higher than "−0.7 V" and a potential of a wiring of a second active barrier section is higher than "−0.7 V"

For example, FIG. 12 is a diagram illustrating a case in which a potential of the wiring WL1 of the active barrier section ABU1 is higher than "−0.7 V" and a potential of the wiring WL2 of the active barrier section ABU2 is higher than "−0.7 V". In this case, as illustrated in FIG. 12, a gate voltage (Vg), which is applied to the gate electrode of the depletion type field effect transistor DQ1 electrically connected to the wiring WL1 of the active barrier section ABU1, becomes higher than "−0.7 V". As a result, the depletion type field effect transistor DQ1 is turned on. Similarly, a gate voltage (Vg), which is applied to the gate electrode of the depletion type field effect transistor DQ2 electrically connected to the wiring WL2 of the active barrier section ABU2, also becomes higher than "−0.7 V". As a result, the depletion type field effect transistor DQ2 is also turned on. Accordingly, the wiring WL1 of the active barrier section ABU1 and the wiring WL2 of the active barrier section ABU2 are electrically connected to each other via the depletion type field effect transistor DQ1 and the depletion type field effect transistor DQ2 that are in an on state. Accordingly, the active barrier section ABU1 and the active barrier section ABU2 form the "connected structure". Namely, the "connected structure" is realized when the absolute value of the potential of the active barrier section ABU1 and the absolute value of the potential of the active barrier section ABU2 are smaller than the built-in potential of the pn junction.

Figure 13:
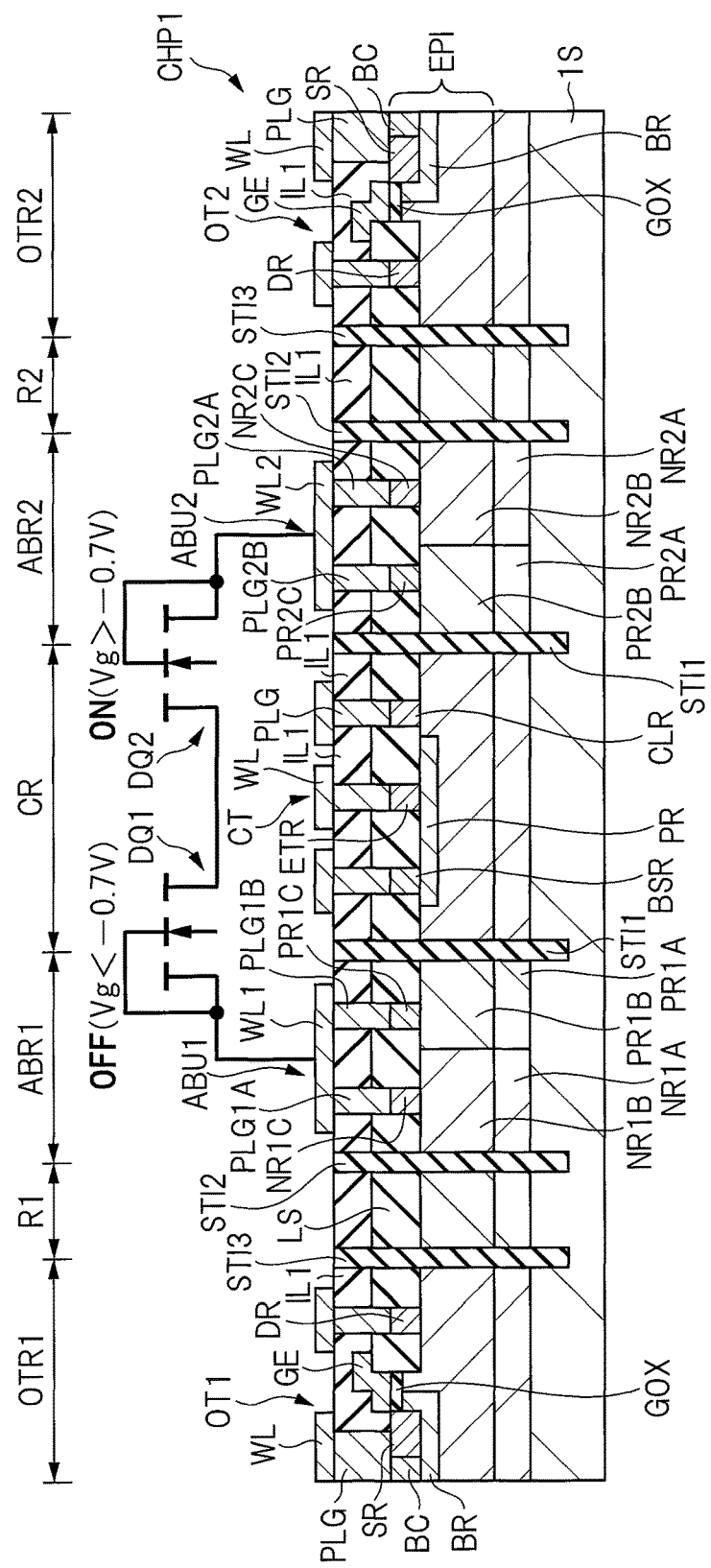
FIG. 13 is a diagram illustrating a case in which the potential of the wiring of the first active barrier section is lower than "−0.7 V" and the potential of the wiring of the second active barrier section is higher than "−0.7 V"

Subsequently, for example, FIG. 13 is a diagram illustrating a case in which the potential of the wiring WL1 of the active barrier section ABU1 is lower than "−0.7 V" and the potential of the wiring WL2 of the active barrier section ABU2 is higher than "−0.7 V". In this case, as illustrated in FIG. 13, the gate voltage (Vg), which is applied to the gate electrode of the depletion type field effect transistor DQ1 electrically connected to the wiring WL1 of the active barrier section ABU1, becomes lower than "−0.7 V". As a result, the depletion type field effect transistor DQ1 is turned off. On the other hand, the gate voltage (Vg), which is applied to the gate electrode of the depletion type field effect transistor DQ2 electrically connected to the wiring WL2 of the active barrier section ABU2, becomes higher than "−0.7 V". As a result, the depletion type field effect transistor DQ2 is turned on. Accordingly, the wiring WL1 of the active barrier section ABU1 and the wiring WL2 of the active barrier section ABU2 are electrically isolated from each other by the depletion type field effect transistor DQ1 which is in an off state. Accordingly, the active barrier section ABU1 and the active barrier section ABU2 form the "isolated structure". Namely, the "isolated structure" is realized when either one of the absolute value of the potential of the active barrier section ABU1 and the absolute value of the potential of the active barrier section ABU2 is larger than the built-in potential of the pn junction. In this manner, it can be understood that it is possible to embody the technical idea in which the "connected structure" and the "isolated structure" are switched depending on whether the potential (absolute value) of the active barrier section exceeds the built-in potential of the pn junction according to the configuration example of the second embodiment illustrated in FIGS. 11 to 13.

Device Structure Example According to Second Embodiment

Figure 14:
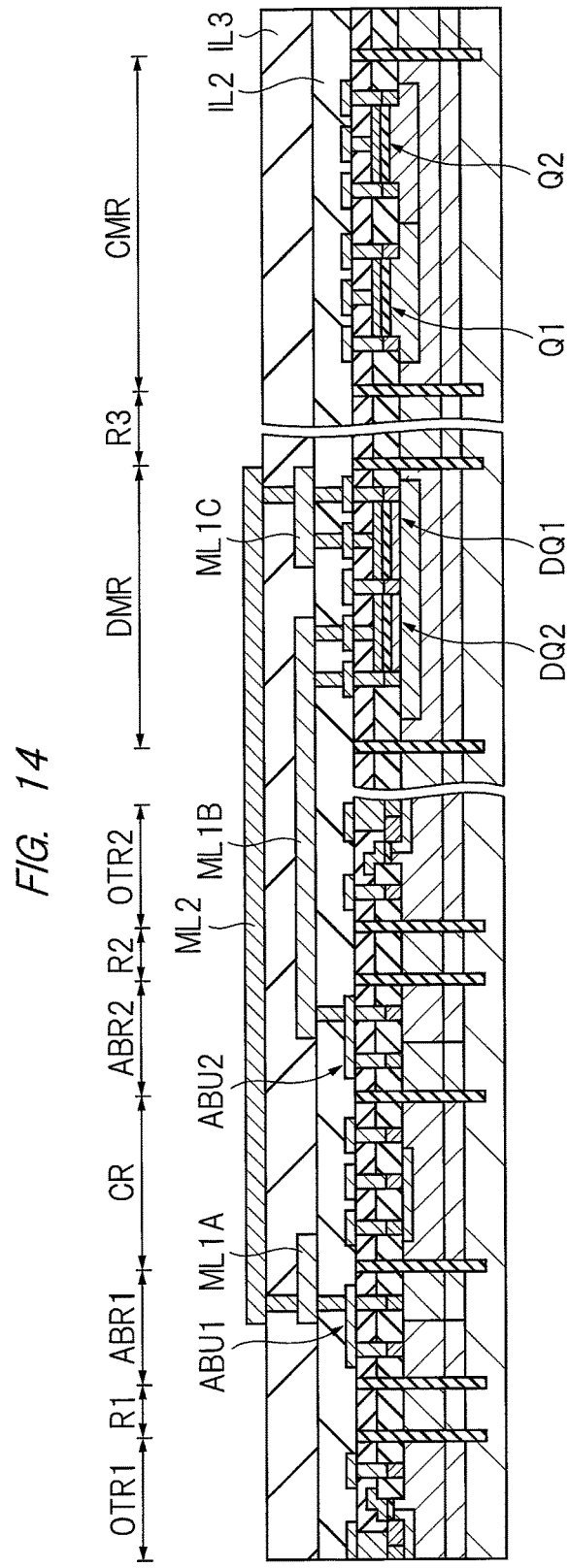
FIG. 14 is a cross-sectional view illustrating an example of a device structure in which the configuration example illustrated in FIG. 11 is realized in a single semiconductor chip.

FIG. 14 is a cross-sectional view illustrating an example of a device structure in which the configuration example illustrated in FIG. 11 is realized in a single semiconductor chip CHP1. In FIG. 14, a depletion type transistor formation region DMR and a CMOS transistor formation region CMR sandwiching a space region R3 are added to the above-described device structure according to the first embodiment illustrated in FIG. 2.

As illustrated in FIG. 14, it can be understood that an n-channel field effect transistor Q1 and a p-channel field effect transistor Q2 are formed in the CMOS transistor formation region CMR, for example. On the other hand, the depletion type field effect transistor DQ1 and the depletion type field effect transistor DQ2, which are connected to each other in series, are formed in the depletion type transistor formation region DMR. Further, the gate electrode and the source (source region) of the depletion type field effect transistor DQ2 are electrically connected to the active barrier section ABU2 via a plug and a wiring ML1B which is a second-layer wiring as illustrated in FIG. 14. On the other hand, the gate electrode and the source (source region) of the depletion type field effect transistor DQ1 are electrically connected to the active barrier section ABU1 via a plug, a wiring ML1A and a wiring ML1C, which are second-layer wirings, and a wiring ML2 which is a third-layer wiring. As described above, it can be understood that the configuration example illustrated in FIG. 11 can be realized by the device structure illustrated in FIG. 14. Note that the configuration example illustrated in FIG. 11 is realized by using the second-layer wiring and the third-layer wiring in the device structure illustrated in FIG. 14, but the structure is not limited thereto and may be configured so that the configuration example illustrated in FIG. 11 is realized by using only the second-layer wiring, for example, by planarly extending the second-layer wiring.

<Manufacturing Method of Semiconductor Device>

Figure 15:
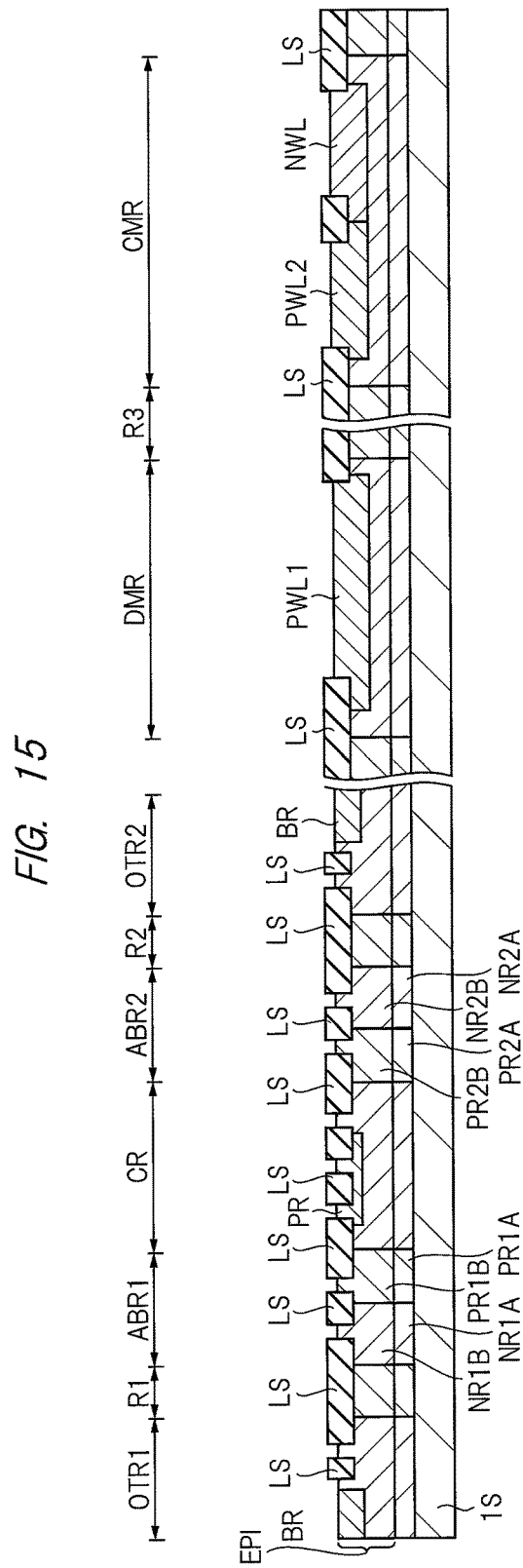
FIG. 15 is a diagram of a manufacturing process of a semiconductor device according to the second embodiment, which corresponds to FIG. 7 describing the manufacturing process of the semiconductor device according to the first embodiment.

The semiconductor device according to the second embodiment is configured as described above, and a manufacturing method thereof will be described below with reference to the drawings. Since the manufacturing method of the semiconductor device according to the second embodiment is substantially the same as that of the semiconductor device according to the first embodiment described above, the description will be given focusing on a different point therebetween. First, FIG. 15 is a diagram which corresponds to FIG. 7 describing the manufacturing process of the semiconductor device according to the first embodiment. In FIG. 15, a patterned resist film is formed on an epitaxial layer EPI by a photolithography technique, and then, n type impurities (for example, phosphorus) are injected into the CMOS transistor formation region CMR by an ion implantation method using this patterned resist film as a mask. Accordingly, an n type well NWL is formed in the CMOS transistor formation region CMR. Further, the patterned resist film is removed by asking, and then, a patterned resist film is newly formed by a photolithography technique. Subsequently, a p type well PWL1 is formed in the depletion type transistor formation region DMR and a p type well PWL2 is formed in the CMOS transistor formation region CMR by an ion implantation method using the newly patterned resist film as a mask.

Figure 16:
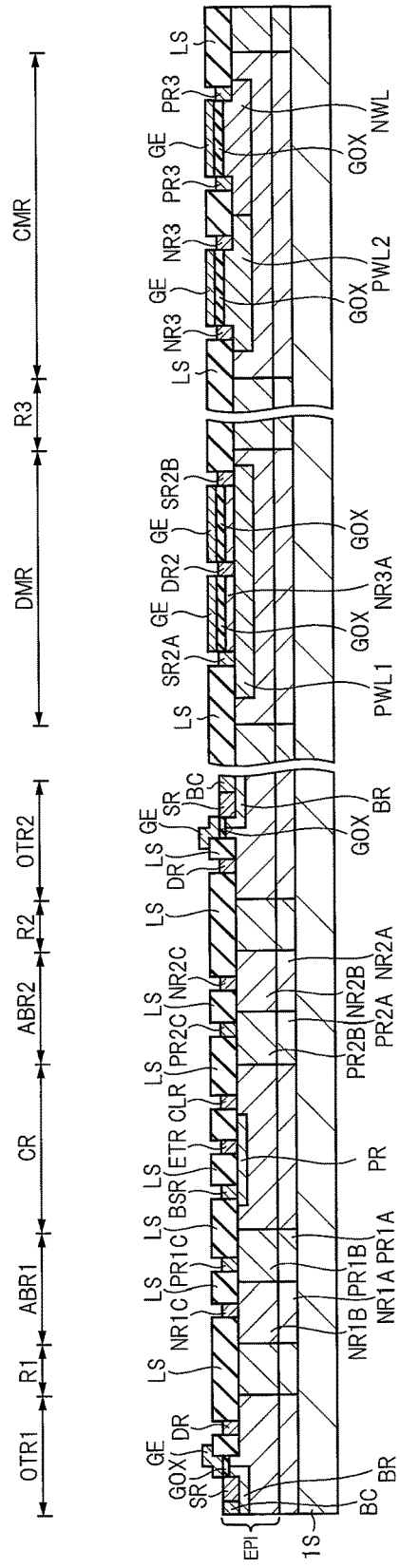
FIG. 16 is a diagram of the manufacturing process of the semiconductor device according to the second embodiment, which corresponds to FIG. 8 describing the manufacturing process of the semiconductor device according to the first embodiment.

Next, FIG. 16 is a diagram which corresponds to FIG. 8 describing the manufacturing process of the semiconductor device according to the first embodiment. In FIG. 16, an n type semiconductor layer NR3A is formed by a photolithography technique and an ion implantation method in order to form an n type inversion layer on a surface of the p type well PWL1 formed in the depletion type transistor formation region DMR. Further, a gate insulating film GOX and a gate electrode GE are formed also in the depletion type transistor formation region DMR and the gate insulating film GOX and the gate electrode GE are formed also in the CMOS transistor formation region CMR through the gate insulating film formation process and the gate electrode formation process described in the first embodiment above.

Thereafter, n type impurities (for example, arsenic) are introduced into the depletion type transistor formation region DMR and the CMOS transistor formation region CMR by a photolithography technique and an ion implantation method. Accordingly, source regions (SR2A and SR2B) and a drain region DR2 formed of an $n^+$ type semiconductor region are formed in the depletion type transistor formation region DMR, and an $n^+$ type semiconductor region NR3 is formed in the CMOS transistor formation region CMR.

Further, p type impurities (for example, boron) are introduced into the CMOS transistor formation region CMR by a photolithography technique and an ion implantation method. Accordingly, a $p^+$ type semiconductor region PR3 is formed in the CMOS transistor formation region CMR.

Figure 17:
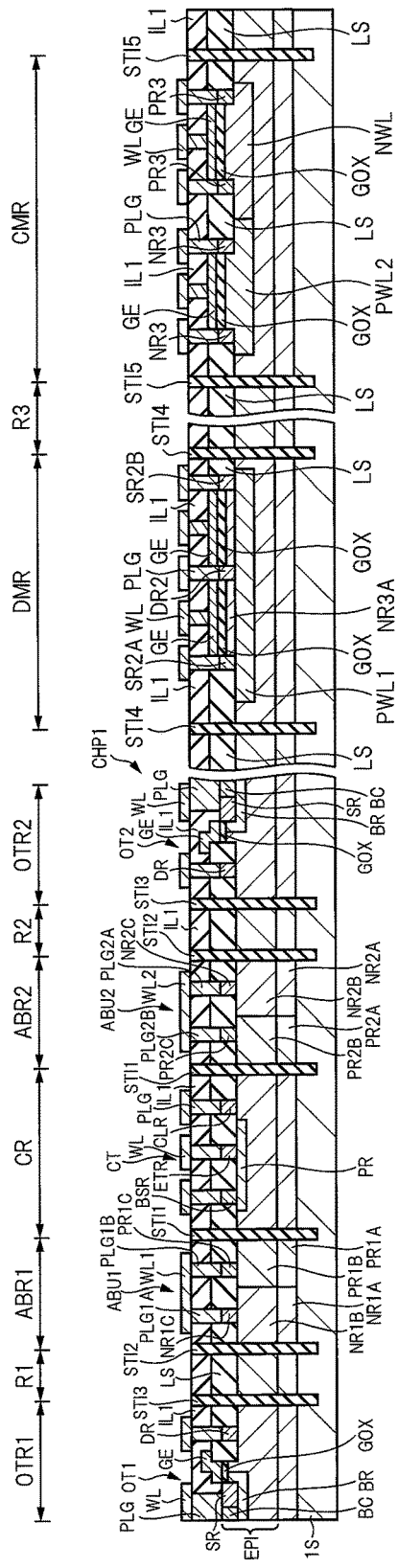
FIG. 17 is a diagram of the manufacturing process of the semiconductor device according to the second embodiment, which corresponds to FIG. 2 describing the manufacturing process of the semiconductor device according to the first embodiment.

Subsequently, FIG. 17 is a diagram which corresponds to FIG. 2 describing the manufacturing process of the semiconductor device according to the first embodiment. In FIG. 17, plugs PLG and wirings WL are formed in the depletion type transistor formation region DMR and the CMOS transistor formation region CMR, and then, an isolation section STI4 is formed in the depletion type transistor formation region DMR and an isolation section STI5 is formed in the CMOS transistor formation region CMR.

Thereafter, after an interlayer insulating film IL2 is formed, plugs that penetrate the interlayer insulating film IL2 are formed, and then, the wirings (ML1A, ML1B and ML1C), which are the second-layer wirings, are formed on the interlayer insulating film IL2 as illustrated in FIG. 14. Further, after an interlayer insulating film IL3 is formed on the interlayer insulating film IL, plugs that penetrate the interlayer insulating film IL3 are formed, and then, the wiring ML2, which is the third-layer wiring, is formed on the interlayer insulating film IL3. At this time, the gate electrode and the source (source region) of the depletion type field effect transistor DQ2 are electrically connected to the active barrier section ABU2 via the plug and the wiring ML1B as illustrated in FIG. 14. On the other hand, the gate electrode and the source (source region) of the depletion type field effect transistor DQ1 are electrically connected to the active barrier section ABU1 via the plug, the wiring ML1A, the wiring ML1C and the wiring ML2. The semiconductor device according to the second embodiment can be manufactured in the above-described manner.

First Modification Example

Although the example of using the depletion type field effect transistor DQ1 and the depletion type field effect transistor DQ2 has been described in the second embodiment, the technical idea of the second embodiment is not limited thereto, and for example, a junction transistor can also be used instead of the depletion type field effect transistor DQ1 and the depletion type field effect transistor DQ2.

Second Modification Example

For example, the technical idea of the second embodiment can be applied also to the configuration having the planar layout illustrated in FIG. 10. In this case, two depletion type field effect transistors, which are connected to each other in series, are connected between two arbitrary active barrier sections among the eight active barrier sections ABU1 to ABU8. In this manner, it is possible to embody the basic idea of the second embodiment also in the configuration having the planar layout illustrated in FIG. 10.

Third Modification Example

The configuration example in which the depletion type field effect transistor DQ1 and the depletion type field effect transistor DQ2 that are connected to each other in series are formed in the semiconductor chip CHP1 has been described in the second embodiment. However, the basic idea of the second embodiment is not limited thereto, and it is also possible to provide an on/off control unit, which has the same function as the depletion type field effect transistor DQ1 and the depletion type field effect transistor DQ2 that are connected to each other in series, outside the semiconductor chip CHP1.

Figure 18:
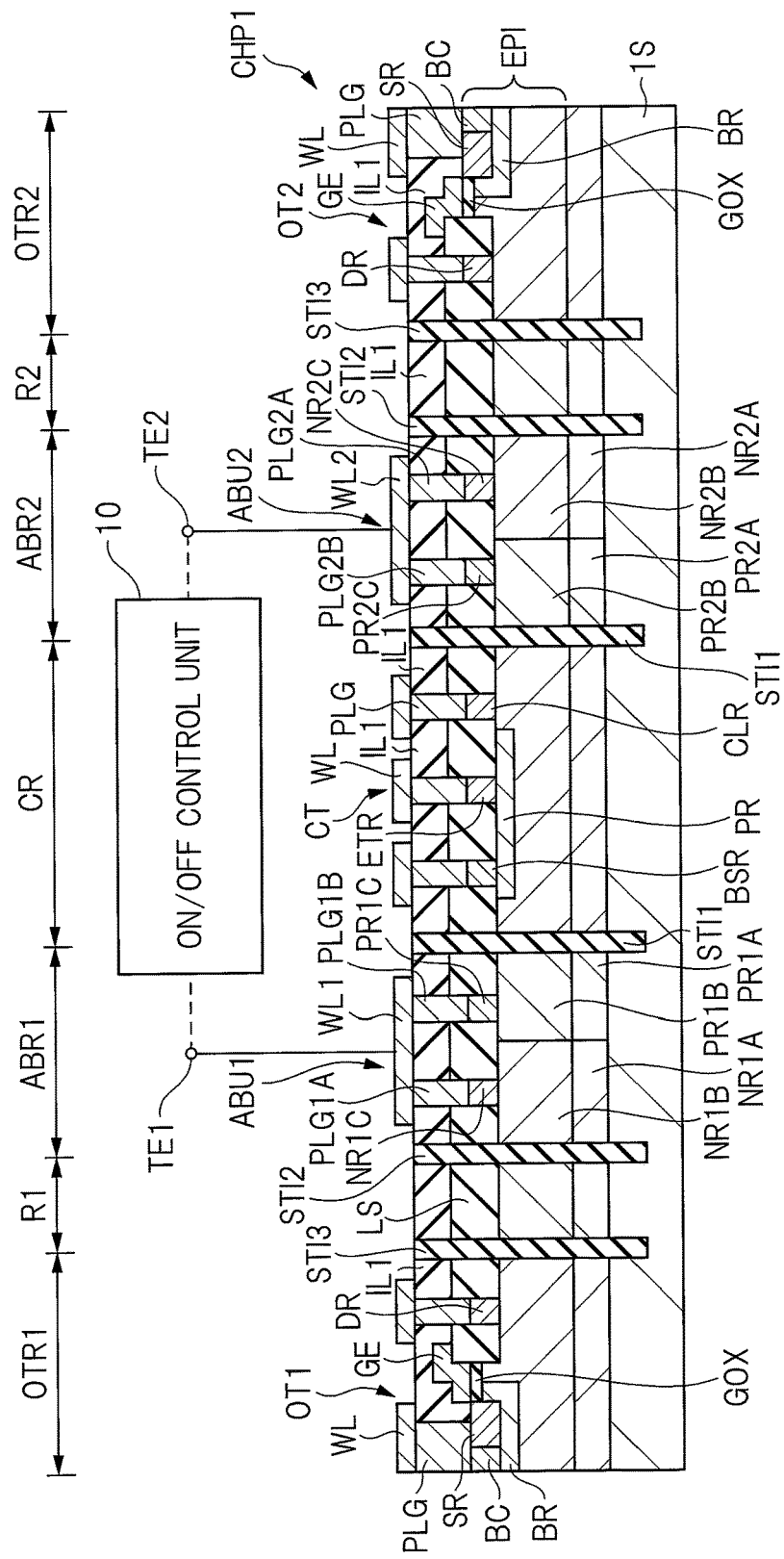
FIG. 18 is a diagram schematically illustrating a configuration in which an on/off control unit is provided outside the semiconductor chip.

For example, FIG. 18 is a diagram schematically illustrating a configuration in which an on/off control unit 10 is provided outside the semiconductor chip CHP1. As illustrated in FIG. 18, the semiconductor chip CHP1 includes a terminal TE1 which is electrically connected to a wiring WL1 serving as a component of an active barrier section ABU1 and a terminal TE2 which is electrically connected to a wiring WL2 serving as a component of an active barrier section ABU2. Further, the on/off control unit 10, which controls conduction and non-conduction between the wiring WL1 serving as the component of the active barrier section ABU1 and the wiring WL2 serving as the component of the active barrier section ABU2, is configured so as to be connected between the terminal TE1 and the terminal TE2. The basic idea of the second embodiment can be embodied also by the third modification example configured in this manner. According to the configuration of the third modification example, it is possible to switch the "connected structure" and the "isolated structure" depending on a predetermined condition by the on/off control unit 10, and since it is unnecessary to provide the on/off control unit 10 inside the semiconductor chip CHP1, it is possible to suppress an increase in size of the semiconductor chip CHP1.

In the foregoing, the invention made by the inventor of the present invention has been concretely described based on the embodiments. However, it is needless to say that the present invention is not limited to the foregoing embodiments and various modifications and alterations can be made within the scope of the present invention.

What is claimed is:

1. A semiconductor device comprising:
   a first output element;
   a second output element that is provided to be spaced apart from the first output element when seen in a plan view;
   a circuit unit that is provided between the first output element and the second output element when seen in a plan view;
   a first element isolation section that is configured in a closed pattern enclosing the circuit unit when seen in a plan view;
   a second element isolation section that is configured in a closed pattern enclosing the first element isolation section while spaced apart from the first element isolation section when seen in a plan view;
   an isolation section that is connected to the first element isolation section and the second element isolation section and separates a region sandwiched between the first element isolation section and the second element isolation section into a first region and a second region;
   a first barrier section that is enclosed by the first region when seen in a plan view; and
   a second barrier section that is enclosed by the second region when seen in a plan view.

2. The semiconductor device according to claim 1, wherein the first output element is connectable to a load having an inductance, and
   the second output element is connectable to a load having an inductance.

3. The semiconductor device according to claim 1, wherein the first output element is configured of a switching element, and
   the second output element is configured of a switching element.

4. The semiconductor device according to claim 3, wherein the first output element is a first low-side element of a first output unit which includes a first high-side element and the first low-side element, and
   the second output element is a second low-side element of a second output unit which includes a second high-side element and the second low-side element.

5. The semiconductor device according to claim 1, wherein the first output element is configured of a power transistor, and
   the second output element is configured of a power transistor.

6. The semiconductor device according to claim 1, wherein the circuit unit includes:
   a first control circuit unit which controls the first output element; and
   a second control circuit unit which controls the second output element.

7. The semiconductor device according to claim 1, wherein the first barrier section suppresses injection of a charge from the first output element into the circuit unit, and
   the second barrier section suppresses injection of a charge from the second output element into the circuit unit.

8. The semiconductor device according to claim 1, further comprising:
   a semiconductor substrate of a first conductivity type;
   the first output element formed on the semiconductor substrate;
   the second output element formed on the semiconductor substrate;
   the first barrier section formed on the semiconductor substrate; and
   the second barrier section formed on the semiconductor substrate,
   wherein the first barrier section includes:
   a first semiconductor layer which is formed on the semiconductor substrate and is of the first conductivity type;
   a second semiconductor layer which is formed on the semiconductor substrate, is adjacent to the first semiconductor layer, is farther from the circuit unit than the first semiconductor layer, and is of a second conductivity type opposite to the first conductivity type; and
   a first conductor pattern which electrically connects the first semiconductor layer and the second semiconductor layer, and
   the second barrier section includes:
   a third semiconductor layer which is formed on the semiconductor substrate and is of the first conductivity type;
   a fourth semiconductor layer which is formed on the semiconductor substrate, is adjacent to the third semiconductor layer, is farther from the circuit unit than the third semiconductor layer, and is of the second conductivity type; and
   a second conductor pattern which electrically connects the third semiconductor layer and the fourth semiconductor layer.

9. The semiconductor device according to claim 8, wherein the second semiconductor layer is arranged at a position closer to the first output element than the first semiconductor layer, and
   the fourth semiconductor layer is arranged at a position closer to the second output element than the third semiconductor layer.

10. The semiconductor device according to claim 8, wherein the first element isolation section is configured to have a structure in which an insulating film is embedded in a first trench,
    the second element isolation section is configured to have a structure in which an insulating film is embedded in a second trench,
    the first trench reaches the semiconductor substrate, and
    the second trench reaches the semiconductor substrate.

11. The semiconductor device according to claim 8, wherein the first conductor pattern is configured of a metal wiring, and
    the second conductor pattern is configured of a metal wiring.

12. The semiconductor device according to claim 8,
wherein a planar size of the first conductor pattern and a planar size of the second conductor pattern are equal to each other.

13. The semiconductor device according to claim 12,
wherein the first conductor pattern and the second conductor pattern are arranged to be symmetrical with respect to the circuit unit.

14. The semiconductor device according to claim 8,
wherein a planar size of the first conductor pattern and a planar size of the second conductor pattern are different from each other.

15. The semiconductor device according to claim 8, further comprising:
a first field effect transistor and a second field effect transistor that are connected to each other in series between the first conductor pattern and the second conductor pattern,
wherein the first field effect transistor is of a depletion type, and the second field effect transistor is of a depletion type.

16. The semiconductor device according to claim 8, further comprising:
a first terminal that is electrically connected to the first conductor pattern; and
a second terminal that is electrically connected to the second conductor pattern,
wherein an on/off control unit, which controls conduction and non-conduction between the first conductor pattern and the second conductor pattern, is connectable between the first terminal and the second terminal.

17. A semiconductor device comprising:
a first output element;
a second output element that is provided to be spaced apart from the first output element when seen in a plan view;
a circuit unit that is provided between the first output element and the second output element when seen in a plan view;
a first element isolation section that is configured in a closed pattern enclosing the circuit unit when seen in a plan view;
a second element isolation section that is configured in a closed pattern enclosing the first element isolation section while spaced apart from the first element isolation section when seen in a plan view;
an isolation section that is connected to the first element isolation section and the second element isolation section and separates a region sandwiched between the first element isolation section and the second element isolation section into a plurality of isolation regions; and
a barrier section that is enclosed by each of the plurality of isolation regions when seen in a plan view.

\* \* \* \* \*